United States Patent
Nook et al.

(10) Patent No.: US 11,251,507 B2
(45) Date of Patent: Feb. 15, 2022

(54) BATTERY

(71) Applicant: THE NOCO COMPANY, Glenwillow, OH (US)

(72) Inventors: Jonathan Lewis Nook, Shaker Heights, OH (US); James Richard Stanfield, Peoria, AZ (US); Derek Michael Underhill, Tempe, AZ (US); James P. McBride, Phoenix, AZ (US); Matthew Michael Bosway, Gilbert, AZ (US)

(73) Assignee: THE NOCO COMPANY, Glenwillow, OH (US)

( * ) Notice: Subject to any disclaimer, the term of this patent is extended or adjusted under 35 U.S.C. 154(b) by 144 days.

(21) Appl. No.: 16/564,758

(22) Filed: Sep. 9, 2019

(65) Prior Publication Data

US 2020/0343521 A1    Oct. 29, 2020

Related U.S. Application Data

(60) Provisional application No. 62/839,348, filed on Apr. 26, 2019, provisional application No. 62/892,785, filed on Aug. 28, 2019.

(51) Int. Cl.

| | |
|---|---|
| *H01M 2/30* | (2006.01) |
| *H01M 50/543* | (2021.01) |
| *H01M 10/0525* | (2010.01) |
| *H01R 11/28* | (2006.01) |
| *H01M 50/20* | (2021.01) |
| *H01M 50/103* | (2021.01) |
| *H01M 50/256* | (2021.01) |
| *H01M 50/502* | (2021.01) |

(52) U.S. Cl.
CPC ..... *H01M 50/543* (2021.01); *H01M 10/0525* (2013.01); *H01M 50/103* (2021.01); *H01M 50/20* (2021.01); *H01M 50/256* (2021.01); *H01M 50/502* (2021.01); *H01R 11/287* (2013.01); *H01R 11/288* (2013.01)

(58) Field of Classification Search
CPC .......... H01M 10/0525; H01M 10/425; H01M 50/103; H01M 50/20; H01M 50/256; H01M 50/258; H01M 50/502; H01M 50/543; H01R 11/287; H01R 11/288; Y02E 60/10
See application file for complete search history.

(56) References Cited

U.S. PATENT DOCUMENTS

| | | | |
|---|---|---|---|
| 2001/0007727 A1* | 7/2001 | Bolstad .................... | B60K 1/04 429/100 |
| 2010/0330404 A1* | 12/2010 | Nishino .............. | H01M 50/213 429/82 |
| 2012/0082875 A1* | 4/2012 | Watanabe ........... | H01M 10/613 429/71 |
| 2012/0308849 A1* | 12/2012 | Tortstensson ....... | H01M 10/425 429/7 |

* cited by examiner

*Primary Examiner* — Victoria H Lynch
(74) *Attorney, Agent, or Firm* — Vorys, Sater, Seymour and Pease LLP; William L. Klima

(57) ABSTRACT

A battery, for example, a rechargeable battery (e.g. lithium ion battery) having a casing with battery terminals. The casing, for example, includes an upper section, middle section, and lower section connected together. The battery can be connected to one or more battery trays having the same height or different heights for various applications.

36 Claims, 30 Drawing Sheets

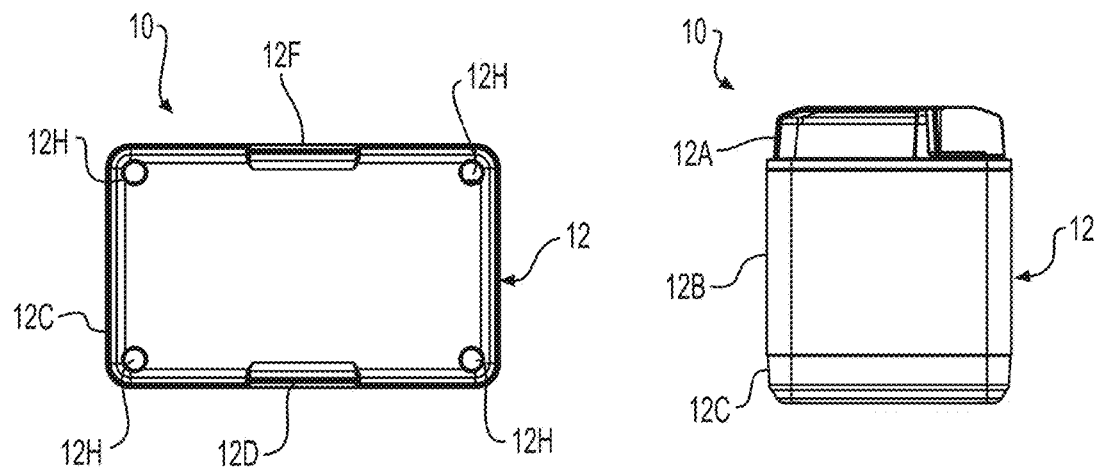
FIG. 5  FIG. 6
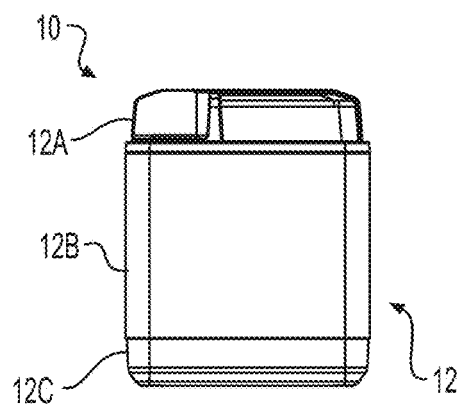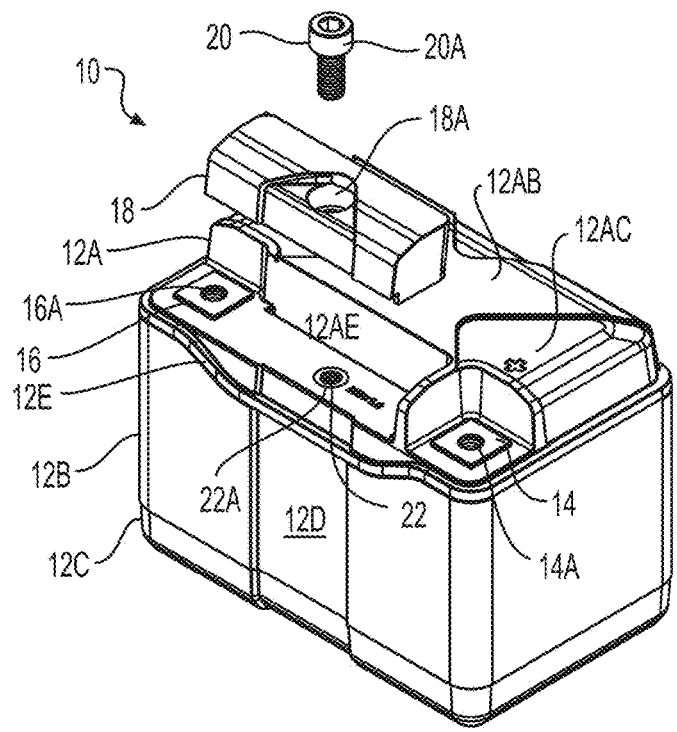
FIG. 7  FIG. 8

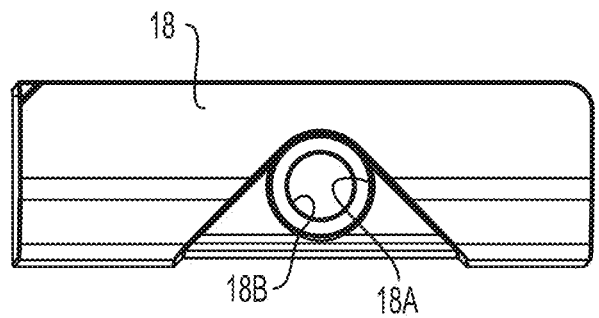
FIG. 12
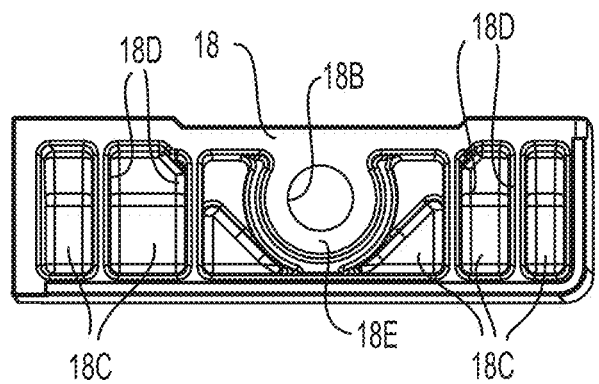
FIG. 13
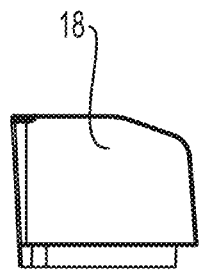     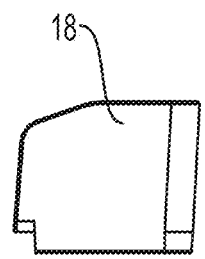
FIG. 14     FIG. 15

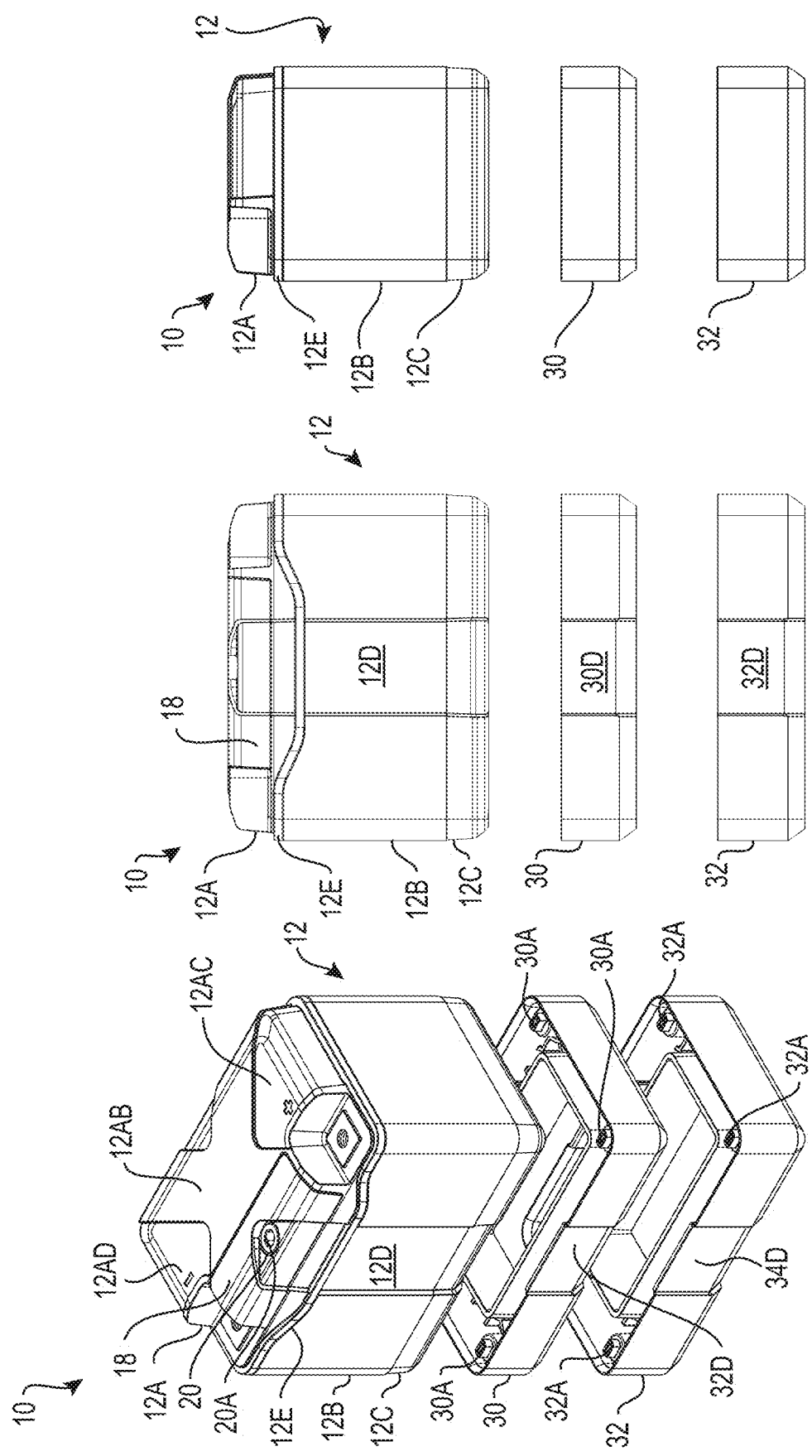

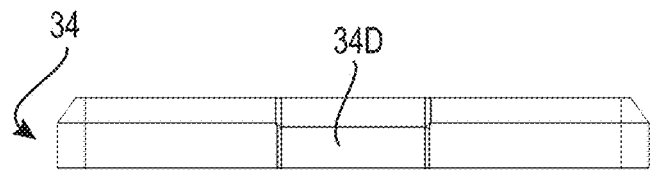
FIG. 33
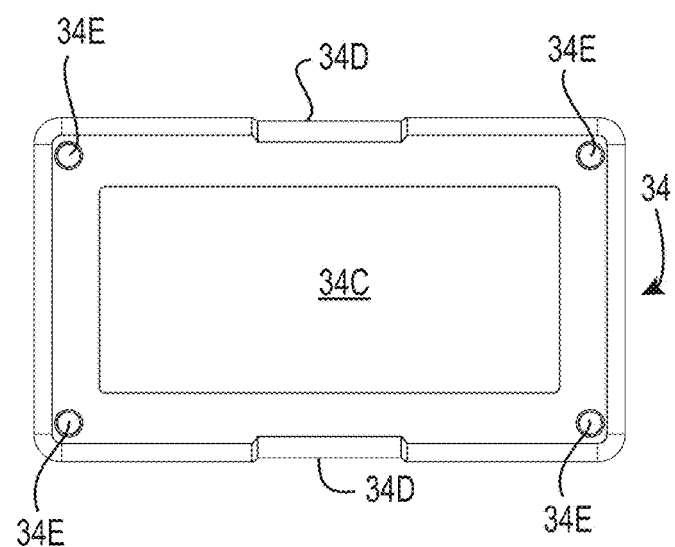
FIG. 34
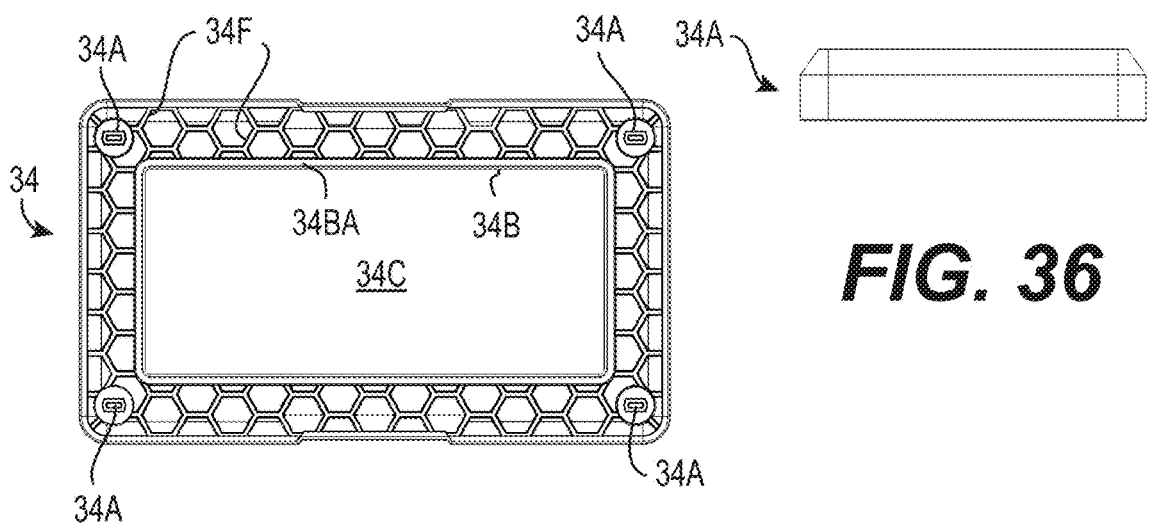
FIG. 35
FIG. 36

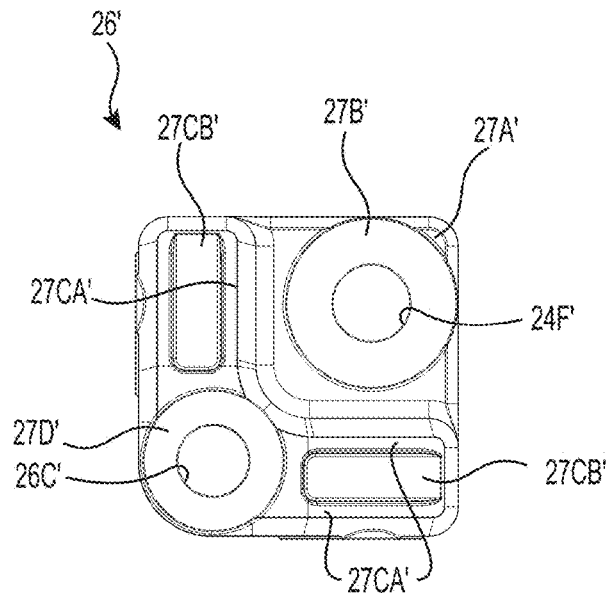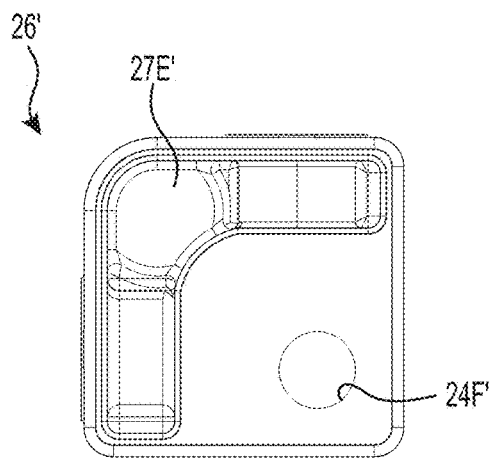
FIG. 53    FIG. 54
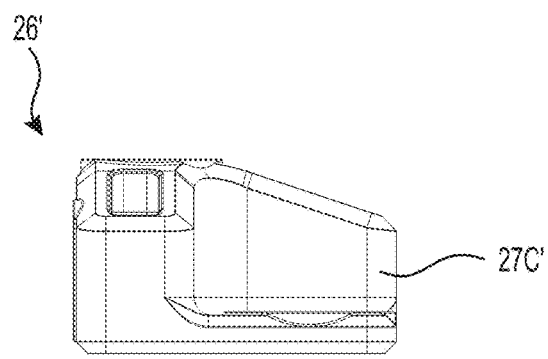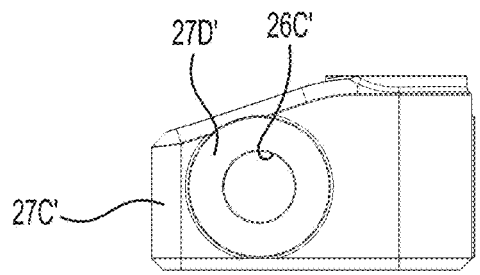
FIG. 55    FIG. 56

BATTERY

FIELD

The present invention is directed to a battery, for example, a rechargeable battery such as a rechargeable lithium ion battery for use in a vehicle such as a motorcycle, road bike, dirt bike, trike, scooter. Moped, automobile, truck, plane, boat, jet ski, recreation vehicle (RV), all-terrain vehicle (ATV), four wheeler, and other applications (e.g. electrical back-up unit).

BACKGROUND

Typically, most vehicle batteries in use today are lead acid batteries. However, more recently, lithium ion batteries or other rechargeable battery chemistries are being developed for use in vehicles and other applications.

There exists a need for improved batteries.

SUMMARY

The rechargeable battery according to the present invention, for example, is a rechargeable lithium ion battery for use in a vehicle. The rechargeable battery according to the present can also be used with other battery chemistries.

The rechargeable battery comprises a casing having a positive terminal, a negative terminal, and one or more internal cells contained within the battery casing. For example, the rechargeable battery comprises multiple cells (e.g. six cells) connected together in series providing or connected to a positive terminal and negative terminal. For example, the individual battery cells each have a positive tab and negative tab so that the positive tab of one cell can be connected (e.g. soldered, fastened, or otherwise connected) to the negative tab of the next cell to provide a series arrangement between the cells.

The battery casing, for example, can comprise an upper section, middle section, and lower section connected or assembled together. For example, the battery cells can be installed within the battery casing prior to assembly. Further, for example, the upper section, middle section, and lower section can be structured and arranged to connect together (e.g. configured to snap fit together).

The upper section of the battery casing, for example, can be fitted with a positive terminal and a negative terminal made of electrically conductive material (e.g. lead or lead composite metal material). For example, an insert molded type positive terminal and an insert molded type negative terminal is molded into the battery casing. For example, the insert molded type positive terminal and insert molded type negative terminal are molded in spaced apart upper wall portions of the casing.

The casing, for example, is molded (e.g. injection molded, vacuum molded) plastic material (e.g. polyethylene terephthalate, polypropylene). For example, the casing is made of a single layer of material or multiple layers of material (e.g. multiple layers of different plastic materials). Further, the insert molded type positive terminal and insert molded type negative terminal can be insert injection molding to the wall of the battery casing during injection molding of the battery casing.

The insert molded type positive terminal and insert molded type negative terminal can be structured and arranged to connect, respectively, directly to a positive battery cable and a negative battery cable. For example, the insert molded type positive terminal and insert molded type negative terminal can be provided with one or more threaded holes so that a connecting bolt can connect each battery cable to each insert molded type terminal. Alternatively, or in addition, the insert molded type positive terminal and insert molded type negative terminal are each provided with a protrusion or ear having a through hole to allow a bolt and nut to connect each battery cable to each insert molded type terminal.

As another alternative, a positive external terminal and a negative external terminal are connected, respectively, to the insert molded type positive terminal and insert molded type negative terminal. For example, the external terminals are provided with one or more through holes to allow a bolt to connect the respective external terminal to the insert molded type terminal. The external terminals can be provided with one or more threaded holes to allow a bolt to connect the externals terminals to the respective positive battery cable and negative battery cable.

The battery can be structured and arranged to cooperate with one or more battery trays to change the effective height of the battery. For example, the bottom section of the battery casing can be configured to nest within an upper receiver of a battery tray. The battery tray can have different heights. Further, a lower end of the battery tray can be configured to nest within the upper receiver of another battery tray to provide a stacked arrangement of battery trays. For example, a plurality of same height or different height battery trays can be stacked to tailor a final assembled height of the battery with battery trays for a particular battery installation on a vehicle.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the upper section is defined by an outer perimeter wall extending downwardly from an upper wall, wherein the middle section is defined by an outer perimeter wall extending upwardly from a bottom wall, and wherein the lower section is defined by an outer perimeter wall extending upwardly from a bottom wall.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the positive battery terminal is spaced apart from the negative battery terminal, and wherein the positive battery terminal and negative battery terminal extend through the upper wall of the upper section of the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the positive battery terminal is spaced apart from the negative battery terminal, and wherein the positive battery terminal and negative battery terminal extend through the upper wall of the upper section of the battery casing, wherein the positive battery terminal is an insert molded type positive battery terminal insert molded type into the upper wall of the upper section of the battery casing, and wherein the positive battery terminal is an insert molded type positive battery terminal insert molded type into the upper wall of the upper section of the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, further comprising an external removable positive terminal connected to the positive battery terminal, and an external removable negative terminal connected to the negative battery terminal.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the upper section and lower section of the battery casing are heat welded together during assembly of the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the middle section and lower section of the battery casing are configured to snap fit together during assembly of the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the upper section is defined by an outer perimeter wall extending downwardly from an upper wall, wherein the middle section is defined by an outer perimeter wall extending upwardly from a bottom wall, and wherein the lower section is defined by an outer perimeter wall extending upwardly from a bottom wall, further comprising a removable cover disposed within an upper receiver in the upper wall of the upper section of the battery casing.

The presently described subject matter is directed to a battery casing, comprising or consisting of: a top section; a middle section connected to the top section; a lower section connected to the middle section; a positive battery terminal connected to the battery casing; and a negative battery terminal connected to the battery casing, wherein the upper section is defined by an outer perimeter wall extending downwardly from an upper wall, wherein the middle section is defined by an outer perimeter wall extending upwardly from a bottom wall, wherein the lower section is defined by an outer perimeter wall extending upwardly from a bottom wall, further comprising a removable cover disposed within an upper receiver in the upper wall of the upper section of the battery casing, and wherein the removable cover is connected to the upper wall of the upper section of the battery casing by a fastener.

The presently described subject matter is directed to a rechargeable battery, comprising or consisting of: a battery casing comprising a top section, middle section, and lower section connected together; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack.

The presently described subject matter is directed to a rechargeable battery, comprising or consisting of: a battery casing comprising a top section, middle section, and lower section connected together; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, further comprising a positive cable connecting the rechargeable battery pack to the circuit board, and a negative cable connecting the rechargeable battery pack to the circuit board.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein upper section is defined by an outer perimeter wall extending downwardly from an upper wall, wherein the middle section is defined by an outer perimeter wall extending upwardly from a bottom wall, and wherein the lower section is defined by an outer perimeter wall extending upwardly from a bottom wall.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the positive battery terminal is spaced apart from the negative battery terminal, and wherein the positive battery terminal and negative battery terminal extend through the upper wall of the upper section of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the positive battery terminal is spaced apart from the negative battery terminal, and wherein the positive battery terminal and negative battery terminal extend through the upper wall of the upper section of the battery casing, and wherein the positive battery terminal is an insert molded type positive battery terminal insert molded type into the upper wall of the upper section of the battery casing, and wherein the positive battery terminal is an insert molded type positive battery terminal insert molded type into the upper wall of the upper section of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, further comprising an external removable positive terminal connected to the positive battery terminal, and an external removable negative terminal connected to the negative battery terminal.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the upper section and lower section of the battery casing are heat welded together during assembly of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the middle section and lower section of the battery are snap fit together during assembly of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the circuit board comprises multiple spaced apart copper plates.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the circuit board comprises multiple spaced apart copper plates, and wherein the circuit board comprises one or more MOSFETs bridging a pair of the spaced apart copper plates.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the circuit board comprises multiple spaced apart copper plates, wherein the circuit board comprises one or more MOSFETs bridging a pair of the spaced apart copper plates, and wherein the circuit board comprises one or more current sense resistors bridging another pair of spaced apart copper plates.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and wherein each copper plate comprises one or more inclined edges relative to a length dimension of the circuit board.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and wherein each copper plate comprises one or more transverse edges relative to a length dimension of the circuit board.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and wherein the circuit board is physically connected to the positive battery terminal and the negative battery terminal.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and wherein the circuit board is physically connected to the positive battery terminal and the negative battery terminal, and wherein the positive battery terminal includes a threaded portion extending into the casing and physically connecting to the circuit board, and the negative battery terminal includes a threaded portion extending into the casing and physically connecting to the circuit board.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is configured so that the lower end of the battery casing nests within the one or more trays.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is configured with one or more protrusions to connected with one or more receivers in the lower end of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is configured so that the lower end of the battery casing nests within the one or more trays, wherein the one or more trays is configured with one or more protrusions to connected with one or more receivers in the lower end of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, wherein the one or more trays is connected to a lower section of the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is multiple trays connected together with the battery casing.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is multiple trays connected together with the battery casing, and wherein the multiple trays have a same height.

The presently described subject matter is directed to a rechargeable battery, comprising or consisting of: a battery casing; a positive battery terminal connected to the battery casing; a negative battery terminal connected to the battery casing; a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the battery comprise an upper section, middle section, and lower section connected together, and further comprising one or more trays connected to a lower end of the battery casing, wherein the one or more trays is multiple trays connected together with the battery casing, and wherein multiple trays have at least two different heights.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is configured so that the lower end of the battery nests within the battery tray.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is configured so that the lower end of the battery nests within the battery tray, wherein a height of the inner perimeter wall is less than a height of the outer perimeter wall.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery trays comprises one or more protrusions configured to connected to one or more receivers provided in a bottom portion of the battery.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is configured so that the lower end of the battery nests within the battery tray, and wherein the battery trays comprises one or more protrusions configured to connected to one or more receivers provided in a bottom portion of the battery.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is configured so that the lower end of the battery nests within the battery tray, wherein the battery trays comprises one or more protrusions configured to connected to one or more receivers provided in a bottom portion of the battery, and wherein the battery tray is rectangular-shaped, and the one or more protrusions are four protrusions located adjacent to four corners of the battery tray cooperating with four recessed holes in the bottom portion of the battery.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is bottomless inside the inner perimeter wall.

The presently described subject matter is directed to a battery tray for use with a battery for extending a height of the battery, the battery tray comprising or consisting of a lower wall with an inner perimeter wall extending upwardly from the lower wall and an outer perimeter wall extending upwardly from the wall, the inner perimeter wall being spaced apart from the outer perimeter wall, the battery tray being configured to connect to a lower end of the battery, wherein the battery tray is provided with a bottom wall located inside and connected to the inner perimeter wall.

BRIEF DESCRIPTION OF DRAWINGS

FIG. 5 is a bottom view of the battery shown in FIG. 1.
FIG. 6 is a left view of the battery shown in FIG. 1.
FIG. 7 is a right view of the battery shown in FIG. 1.
FIG. 8 is a perspective view showing the cover separated from the battery shown in FIG. 1.
FIG. 12 is a top view of the cover shown in FIG. 8.
FIG. 13 is a bottom view of the cover shown in FIG. 8.
FIG. 14 is a left side view of the cover shown in FIG. 8.
FIG. 15 is a right side view of the cover shown in FIG. 8.

FIG. 24 is an exploded perspective view of the battery shown in FIG. 1 fitted with a pair of different height battery trays.

FIG. 25 is an exploded front view of the battery shown in FIG. 1 fitted with a pair of different height battery trays.

FIG. 26 is an exploded right side view of the battery shown in FIG. 1 fitted with a pair of different height battery trays.

FIG. 33 is a front view of the battery tray shown in FIG. 32.

FIG. 34 is a top view of the battery tray shown in FIG. 32.

FIG. 35 is a bottom view of the battery tray shown in FIG. 32.

FIG. 36 is a left side view of the battery tray shown in FIG. 32.

FIG. 53 is a top view of an external battery terminal shown in FIG. 50.

FIG. 54 is a bottom view of an external battery terminal shown in FIG. 50.

FIG. 55 is a left side view of an external battery terminal shown in FIG. 50.

FIG. 56 is a right side view of an external battery terminal shown in FIG. 50.

DETAILED DESCRIPTION OF PREFERRED EMBODIMENTS

Figure 1:
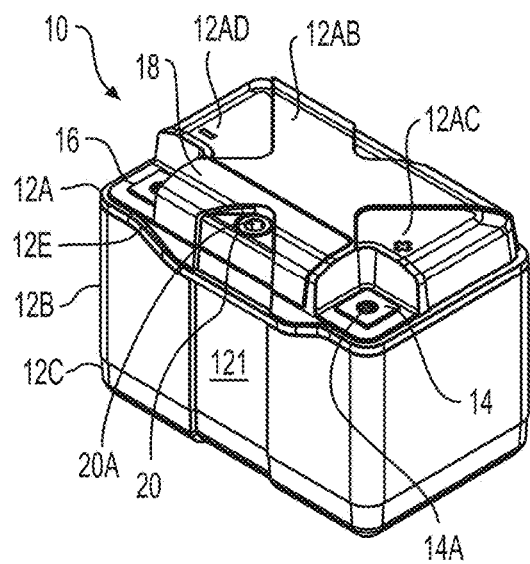
FIG. 1 is a perspective view of a battery according to the present invention.
Figure 2:
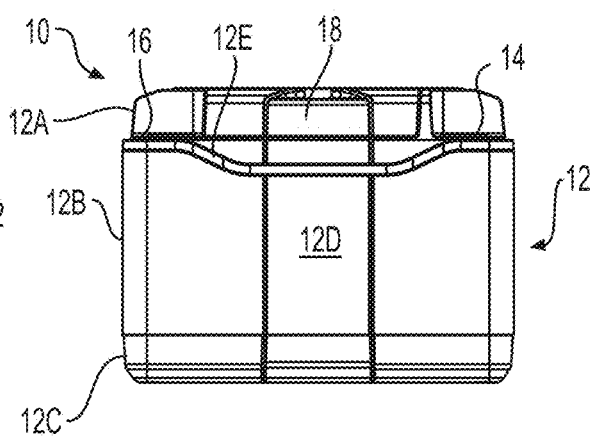
FIG. 2 is a front view of the battery shown in FIG. 1.
Figure 3:
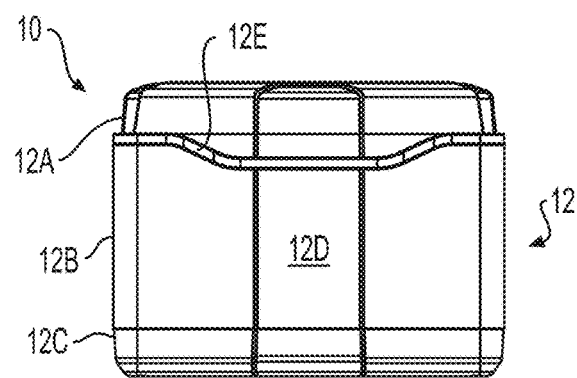
FIG. 3 is a rear view of the battery shown in FIG. 1.
Figure 4:
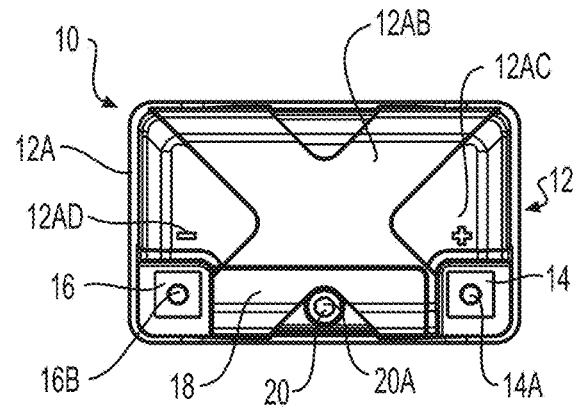
FIG. 4 is a top view of the battery shown in FIG. 1.
Figure 9:
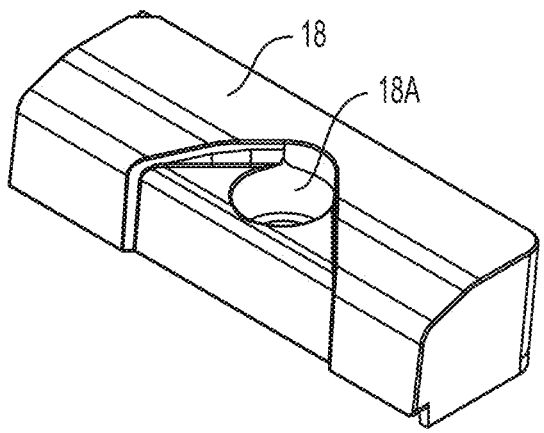
FIG. 9 is perspective view of the cover of the battery shown in FIG. 8.
Figure 10:
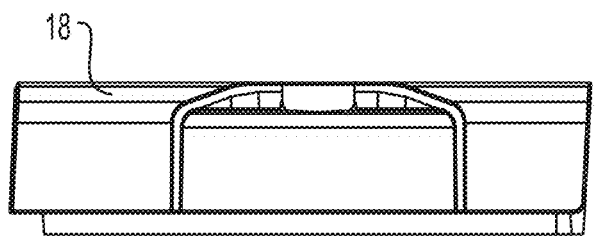
FIG. 10 is front view of the cover shown in FIG. 8.
Figure 11:
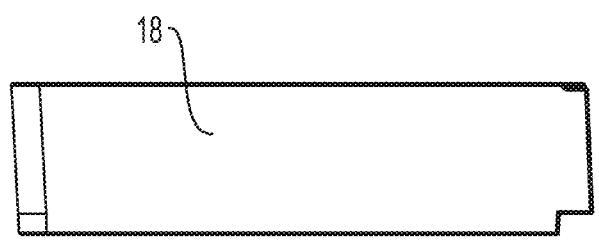
FIG. 11 is a rear view of the cover shown in FIG. 8.

A rechargeable battery 10 according to the present invention is shown in FIG. 1-7. For example, the rechargeable battery 10 is a rechargeable lithium ion battery.

The rechargeable battery 10 comprises a battery casing 12, insert molded type positive battery terminal 14, insert molded type negative battery terminal 16, and a cover 18.

The battery casing 12 comprises an upper section 12A, middle section 12B, and lower section 12C. The insert molded type positive battery terminal 14 and the insert molded type negative battery terminal 16 are spaced apart, and insert molded type into an upper wall 12AA of the upper battery section 12A. The positive battery terminal 14 is provided with a threaded hole 14A and the negative battery terminal 16 is provided with a threaded hole 16B. The threaded holes 14A, 14B accommodate bolt fastener for releasably connecting a positive battery cable and a negative battery cable, respectively, to the positive battery terminal 14 and negative battery terminal 16.

The upper surface of the upper section 12A is provided with an X-shaped protrusion 12AB, a molded positive symbol 12AC, and a molded negative symbol 12AD as shown.

A cover 18 having a bolt head receiver 18A and through hole 18B (FIGS. 9-12) is removably connected to the upper section 12A of the battery casing 12. The cover 18 is removably connected to the upper section 12A of the battery casing via a bolt 20 having a bolt head 20A (FIG. 8) connecting with an insert molded type anchor 22 having a threaded hole 22A, as shown in FIG. 8. The cover 18 fits into a receiver 12AE of the upper section 12A of the battery casing 12. The structure and arrangement of the cover 18 is shown in FIGS. 9-12.

The battery casing 12 includes a vertical channel 12D and a curved horizontal rib 12E on the front side (FIG. 2) thereof, and a vertical channel 12F and a curved horizontal rib 12F on the rear side (FIG. 3) thereof.

The bottom of the lower section 12C (FIG. 5) of the battery casing 12 is provided with four (4) holes 12H located at the corners thereof.

Figure 18:
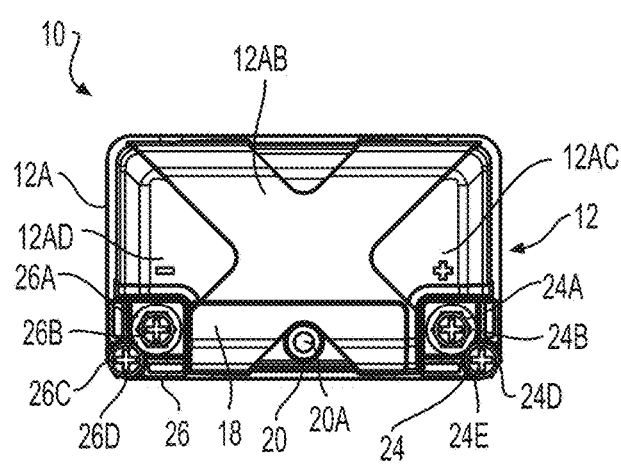
FIG. 18 is a top view of the battery shown in FIG. 16.
Figure 19:
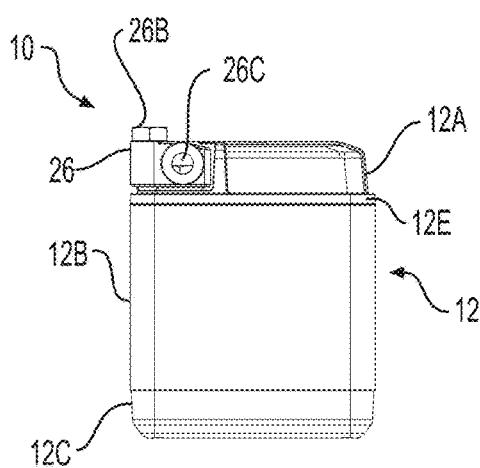
FIG. 19 is left side view of the battery shown in FIG. 16.

The insert molded type positive terminal 14 and insert molded type negative terminal 16 of the rechargeable battery 10 can be directly connected to battery cables, for example, of a vehicle. Specifically, the ends of the battery cables can be fitted with connector ends having through holes to allow bolts to connect the connector ends, respectively, directly to the insert molded type terminals 14, 16. Alternatively, the insert molded type positive terminal 14 and insert molded type negative terminal 16 of the rechargeable battery 10 can be fitted with a positive terminal 24 and a negative terminal 26. Specifically, fastening bolts 24A, 26A can connect, respectively, the terminals 24, 26 to the insert molded type terminals 14, 16. The fastening bolts 24A, 26A, for example, can have Phillips-head type bolt heads 24B, 26B (FIG. 18).

The positive terminal 24 is provided with threaded holes 24C located, for example, on one side or multiple sides (e.g. three sides shown in FIG. 21) of the positive terminal 24. The negative terminal 26 is provided with threaded holes 26C located, for example, on one side or multiple sides (e.g. three sides shown in FIG. 21) of the negative terminal 26. The positive terminal 24 and the negative terminal 26 of the rechargeable battery 10 can be directly connected to battery cables, for example, of a vehicle. Specifically, the ends of the battery cables can be fitted with connector ends having through holes to allow bolts to connect the connector ends, respectively, directly to the terminals 24, 26.

Figures 20, 21:
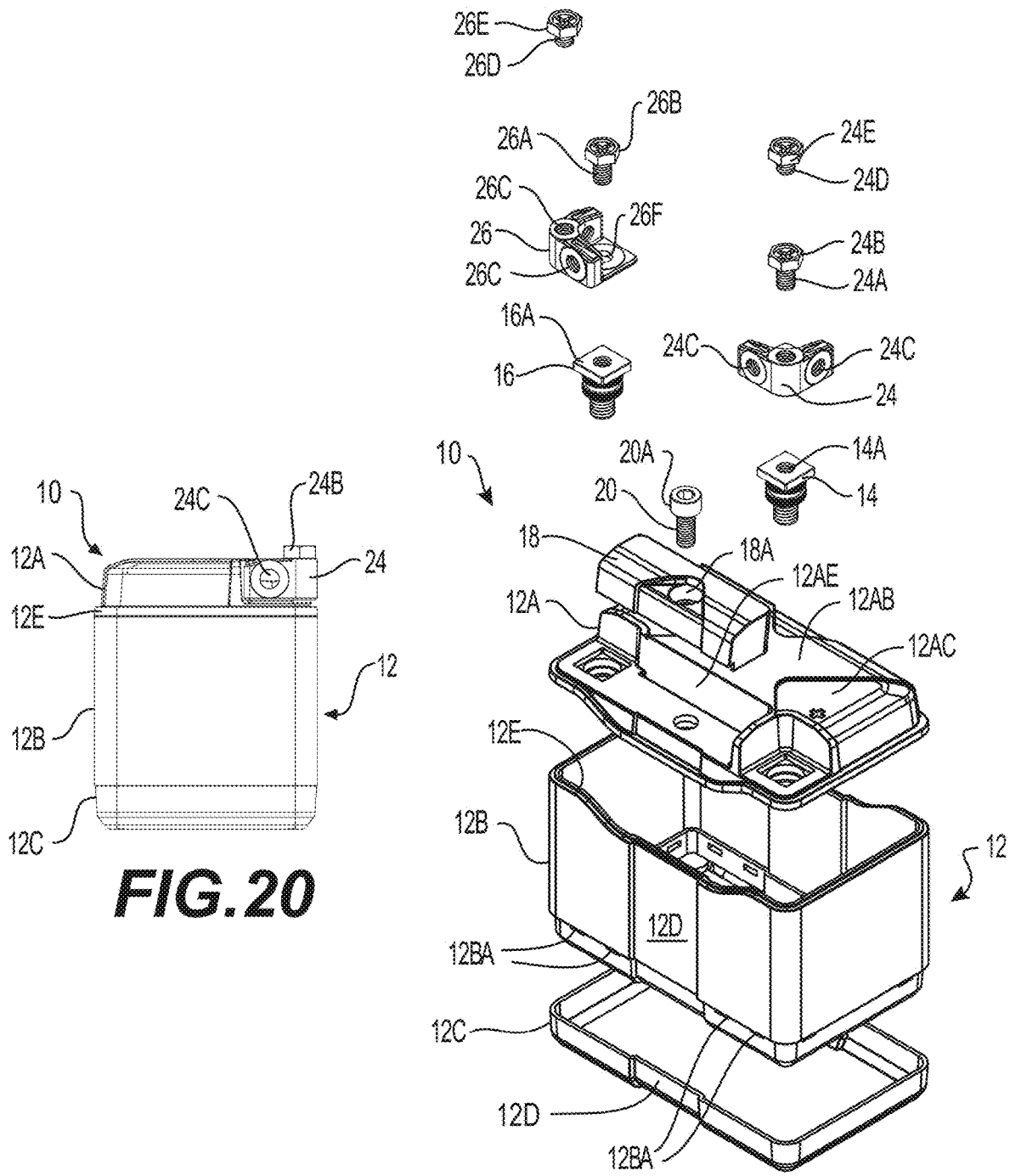
FIG. 20 is a right side view of the battery shown in FIG. 16.
FIG. 21 is an exploded perspective view of the battery shown in FIG. 16.
Figures 22, 23:
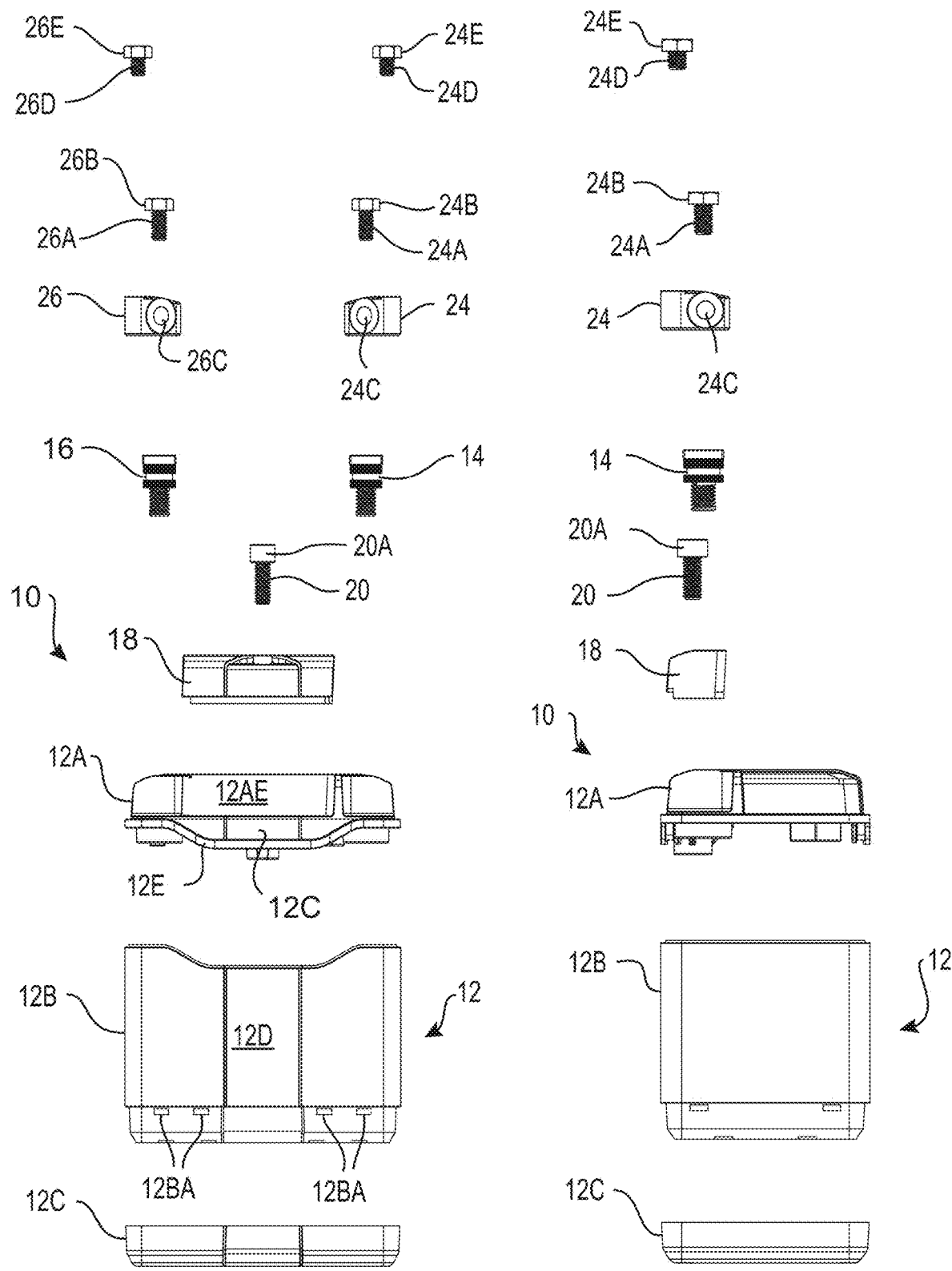
FIG. 22 is an exploded front view of the battery shown in FIG. 16.
FIG. 23 is an exploded right side view of the battery shown in FIG. 16.

The detailed structure and arrangement of the battery casing 12 is shown in FIGS. 21 and 22. The upper section 12A, middle section 12B, and lower section 12C of the battery casing are separate parts (e.g. plastic injection molded parts), for example, that can be heat welded, adhered, and/or snap fit together for assembly of the battery casing 12. For example, the middle section 12B is provided with a plurality of snap fit indents 12BA for cooperating with a plurality of snap fit protrusions (not shown) located on the inside perimeter of the lower section 12C of the battery casing 12.

Figure 16:
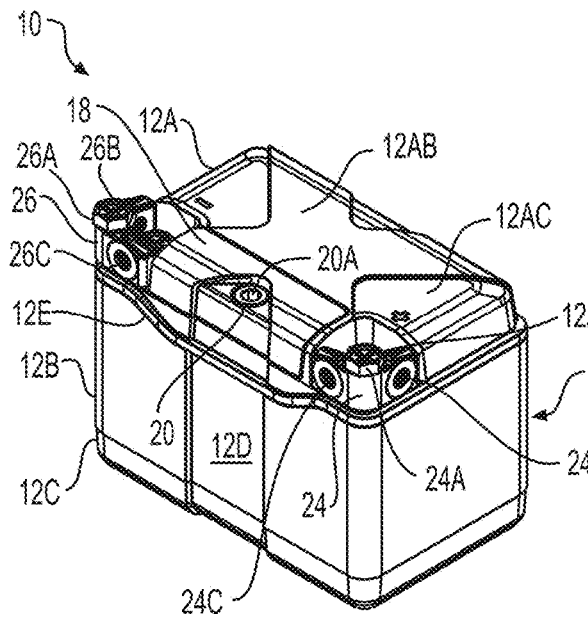
FIG. 16 is a perspective view of battery shown in FIG. 1 fitted with external removable terminals.
Figure 17:
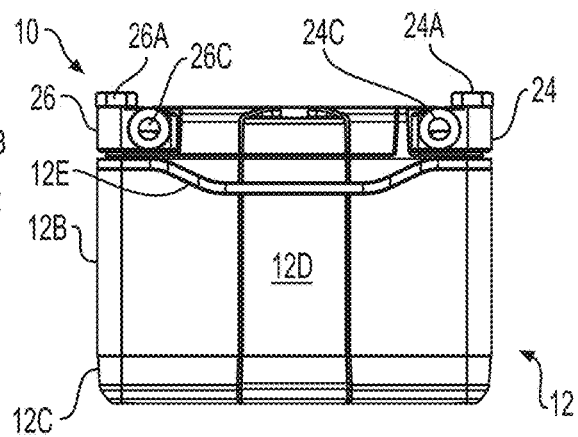
FIG. 17 is a front view of the battery shown in FIG. 16.

The detailed structure and arrangement of the cover 18 configured for cooperating with the receiver 12AE of the upper section 12A of the battery casing is shown in FIGS. 9-15. For example, the cover 18 is a plastic injection molded part. The bottom (FIG. 13) of the cover 18, for example, can be configured with multiple cells 18C defined by multiple ribs 18D to provide added structural strength and light weight features. For example, the multiple ribs 18D are transvers rib relative to a length dimension of the cover 18 resulted in transverse elongated cells. In addition, a reinforcing collar of increased thickness is provided surrounding the through hole 18B to strengthen the hole structure and prevent tearing thereof. The cover 18 assembled onto the upper section 12A of the battery casing 12 is shown in FIG. 16.

Trays

The rechargeable battery 10 can be provided or fitted with one or more trays, as shown in FIGS. 24 and 25. For example, multiple trays can be provided or fitted to the rechargeable battery 10 to provide a "stacked" arrangement for adjusting or tailoring the physical height of the rechargeable battery 10. For example, the rechargeable battery 10 is provided or fitted with a tray 30 and a tray 32, as shown in FIGS. 24 and 25. The tray 32 is thicker in height dimension relative to the tray 30, as shown in FIG. 24.

The tray 30, for example, is configured to connect to the lower section 12C of the battery casing 12. For example, the lower section 12C of the battery casing 12 is configured to nest within the upper side of the tray 30. Alternatively, or in addition, the lower section 12C and/or the tray 30 can be provided with connectors to permanently connect (e.g. using interference fit connectors, snap fit connectors, welded or adhered together connectors) or removably connect (e.g. using male/female type connectors) the lower section 12C and the tray 30 together. For example, the connectors can be protrusions 30A located on the upper side of the tray 30 cooperating with receivers (e.g. holes 12H shown in FIG. 5) located on the lower side of the lower section 12C of the battery casing 12. Alternatively, the protrusions 30A can be pins (e.g. plastic, plastic composite, metal pins, metal alloy pins).

The tray 32, for example, is configured to connect to the lower side of the tray 30. For example, the lower side of the tray 30 is configured to nest within the upper side of the tray 32. Alternatively, or in addition, the tray 30 and/or the tray 32 can be provided with connectors to permanently connect (e.g. using interference fit connectors, snap fit connectors, welded or adhered together connectors) or removably connect (e.g. using male/female type connectors) the tray 30 and tray 32 together. For example, the connectors can be protrusions 32A located on the upper side of the tray 32 cooperating with receivers (e.g. holes 30D) located on the lower side of the tray 30. Alternatively, the protrusions 32A can be pins (e.g. plastic or metal pins).

Figure 27:
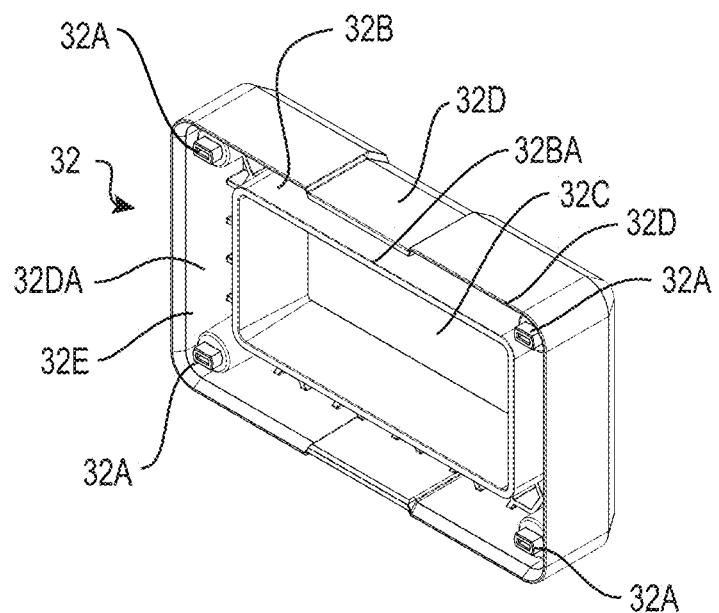
FIG. 27 is a perspective view of the greater height (i.e. thicker) battery tray shown in FIG. 24.
Figure 28:
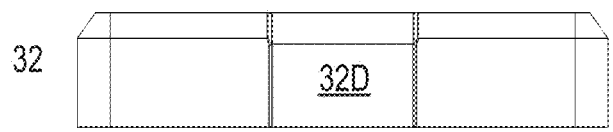
FIG. 28 is a front view of the greater height (i.e. thicker) battery tray shown in FIG. 24.
Figure 29:
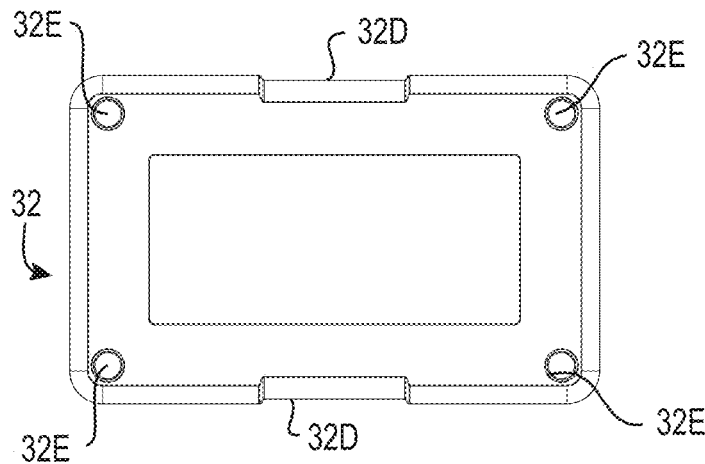
FIG. 29 is a top view of the greater height (i.e. thicker) battery tray shown in FIG. 24.
Figure 30:
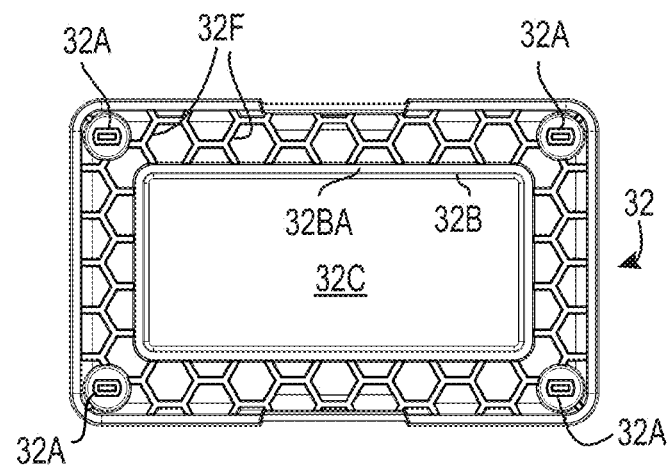
FIG. 30 is a bottom view of the greater height (i.e. thicker) battery tray shown in FIG. 24.
Figures 31, 32:
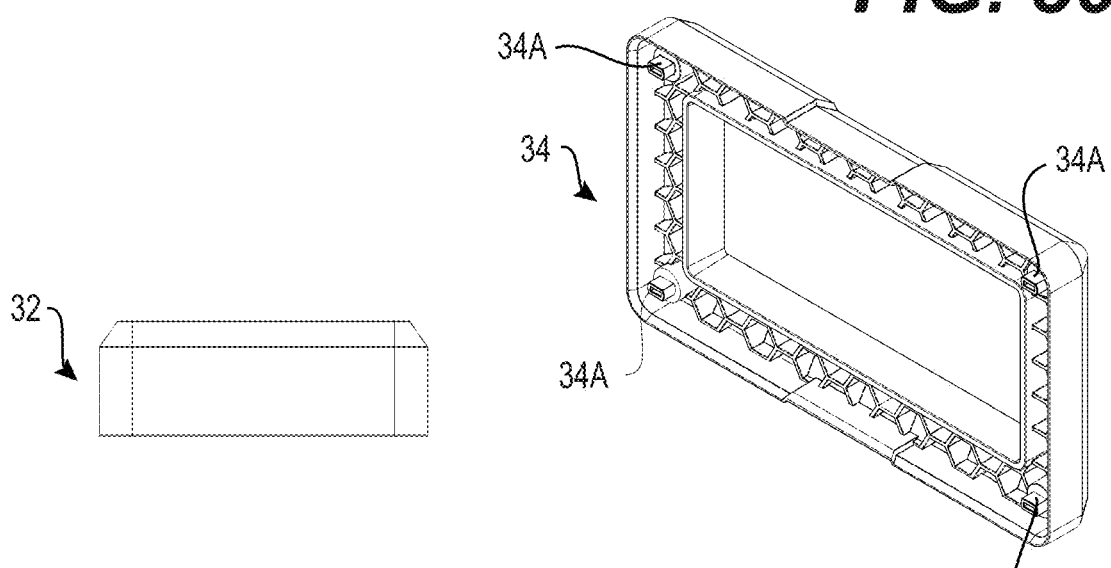
FIG. 31 is a left side view of the greater height (i.e. thicker) battery tray shown in FIG. 24.
FIG. 32 is a perspective view of a less height (i.e. thinner) battery tray shown in FIG. 39.

The details of the tray 32 is shown in FIGS. 27-31. The upper side of the tray 32 is provided with four (4) protrusions 32A located in the corners of the tray 32. The protrusions, for example, can have opposite rounds side and opposite flat sides, as shown in FIG. 30. The trays 32 includes an inner edge 32B defining an opening 32C and a spaced apart surrounding outer edge 32E, as shown in FIG. 27. Alternatively, the opening 32C can be closed by providing wall inside the inner edge 32B.

The height of the inner edge 32B is less than the height of the outer edge 32D so that the lower side of the tray 30 nests within the outer edge 32 of the tray 32, as shown in FIGS. 24-26. Specifically, a receiver 32E for accommodating and nesting with the lower side of the tray 30 is defined by the inner side 32DA of the outer edge 32 and an upper edge 32BA of the inner edge 32B of the tray 32. The upper edge 32BA serves as a stop for ingress of the lower side of the tray 30 into the receiver 32E. After assembly of the tray 30 and tray 32 together, the lower side surface of the tray rests in contact with the upper edge 32BA of the inner edge 32B of the tray 32.

The tray 32 is provided with a channel 32D that is continuous with the channel 12D of the battery casing 12, as shown in FIG. 24.

The lower side of the tray 32 is provided with recessed holes 32E (FIG. 29) for accommodating protrusions of another tray that can be provided or fitted to a lower side of the tray 32 to provide a further "stacked" arrangement of trays. The inner surface of the tray 32 is provided with a cell-shaped ridges 32 structurally reinforcing the lower wall of the tray 32.

Figure 37:
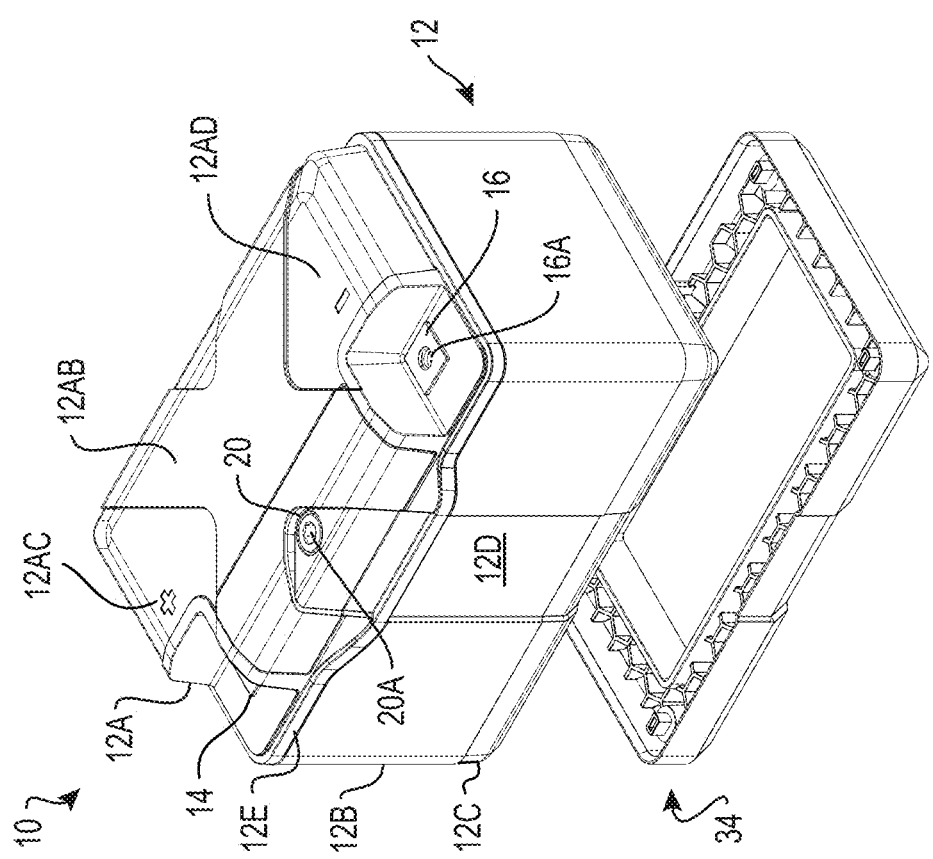
FIG. 37 is an exploded perspective view of the battery shown in FIG. 1 fitted with the battery tray shown in FIG. 32.
Figure 40:
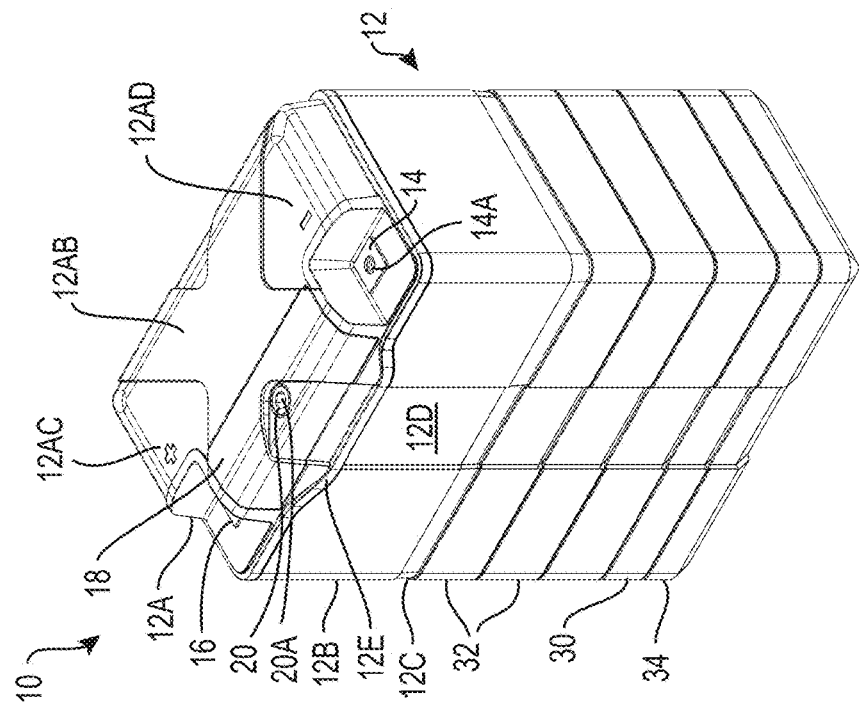
FIG. 40 is a perspective view of the assembled battery shown in FIG. 39.

Another tray 34 is shown in FIGS. 32-36. The tray 34 is a lower profile tray having less height compared to tray 30. The tray 34 can be provided or fitted onto the bottom of rechargeable battery 10, as shown in FIG. 37.

Figure 39:
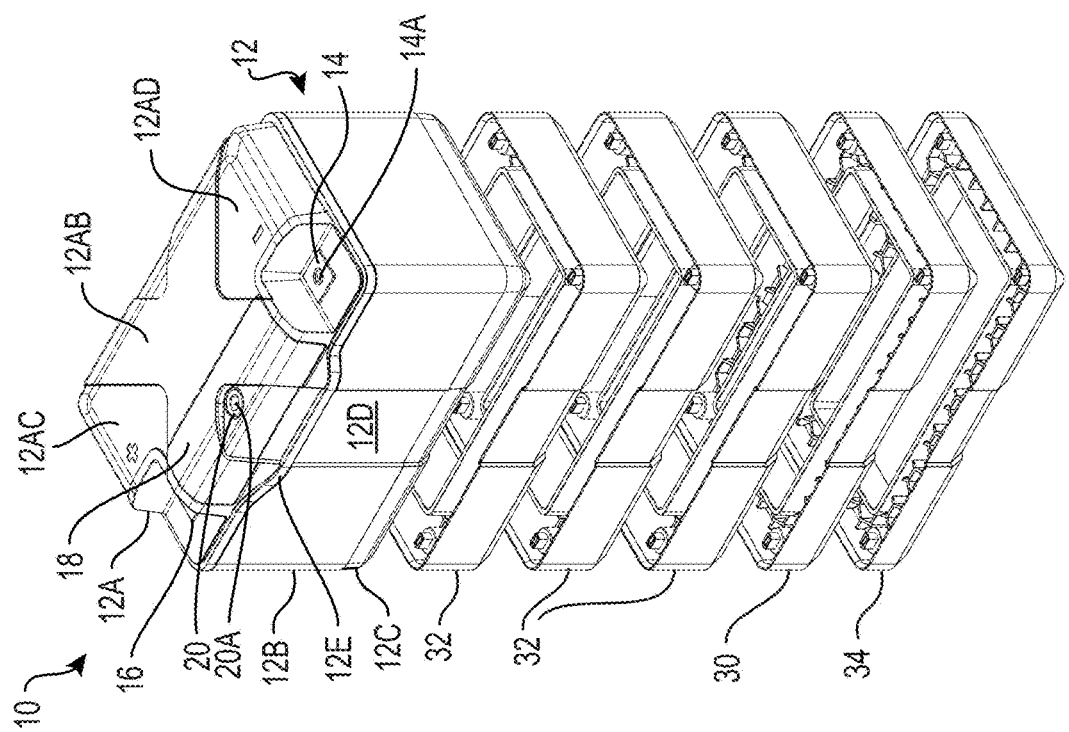
FIG. 39 is an exploded perspective view of the battery shown in FIG. 1 being fitted with a plurality of battery trays of same and different heights (i.e. thicknesses).

The rechargeable battery 10 can be provided or fitted with a single tray or a stack of trays. The trays can have the same height, or can be different heights. For example, the rechargeable battery 10 shown in FIG. 39 is provided or fitted with a stack of trays, including three (3) trays 32, one (1) tray 30, and one (1) tray 34 from the top of the stack to the bottom of the stack. In this manner, the overall height of the rechargeable battery 10 with trays can be varied, adjustable, or otherwise tailored to a particular height application.

Figure 41:
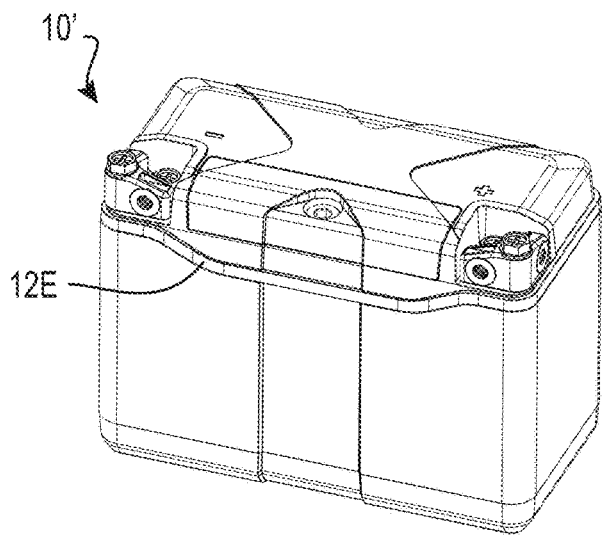
FIG. 41 is a perspective view of another battery according to the present invention having a greater length and less width compared to the battery shown in FIG. 1.
Figure 42:
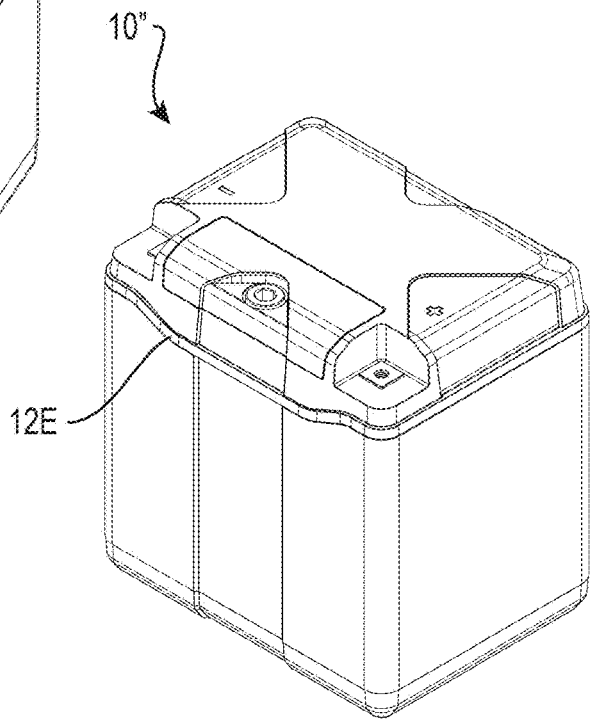
FIG. 42 is perspective view of a further battery according to the present invention having less length and greater width compared to the battery shown in FIG. 1.
Figure 43:
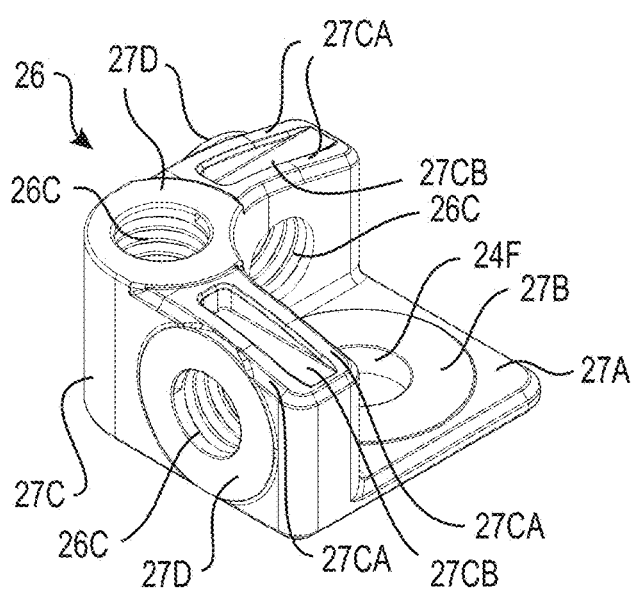
FIG. 43 is a perspective view of an external removable battery terminal according to the present invention for use with the battery shown in FIG. 1.
Figure 44:
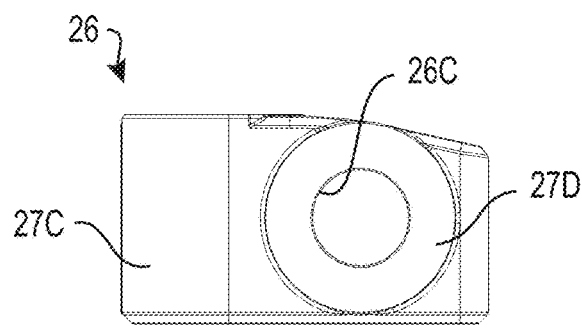
FIG. 44 is a front view of an external removable battery terminal shown in FIG. 43.
Figure 45:
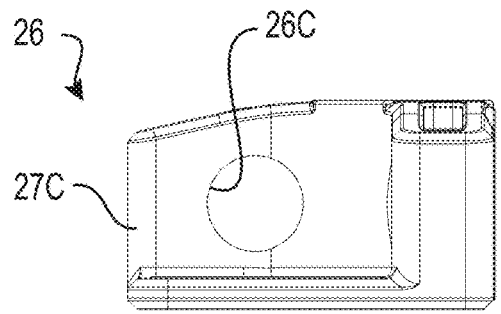
FIG. 45 is a rear view of an external battery shown in FIG. 43.
Figure 46:
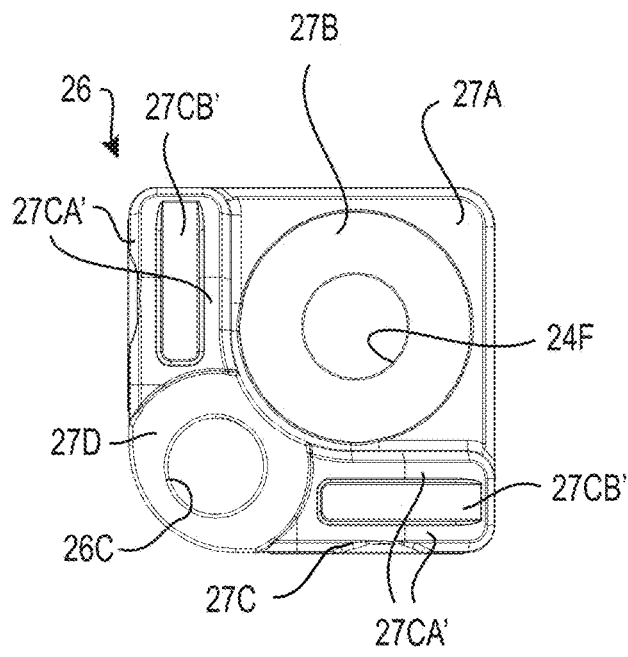
FIG. 46 is a top view of an external battery terminal shown in FIG. 43.

The length, width, and the height of the rechargeable battery according to the present invention can vary depending on the particular application. For example, the rechargeable battery 10' shown in FIG. 41 has a greater length and less width compared to the rechargeable battery 10 shown in FIG. 1. The rechargeable battery 10" shown in FIG. 42 has a shorter length and a greater width compared to the rechargeable battery 10 shown in FIG. 1.

A detailed view of the terminal 26 (FIGS. 21 and 22) is shown in FIGS. 43-49. The terminal 24 is a mirror image of the terminal 26.

Figure 38:
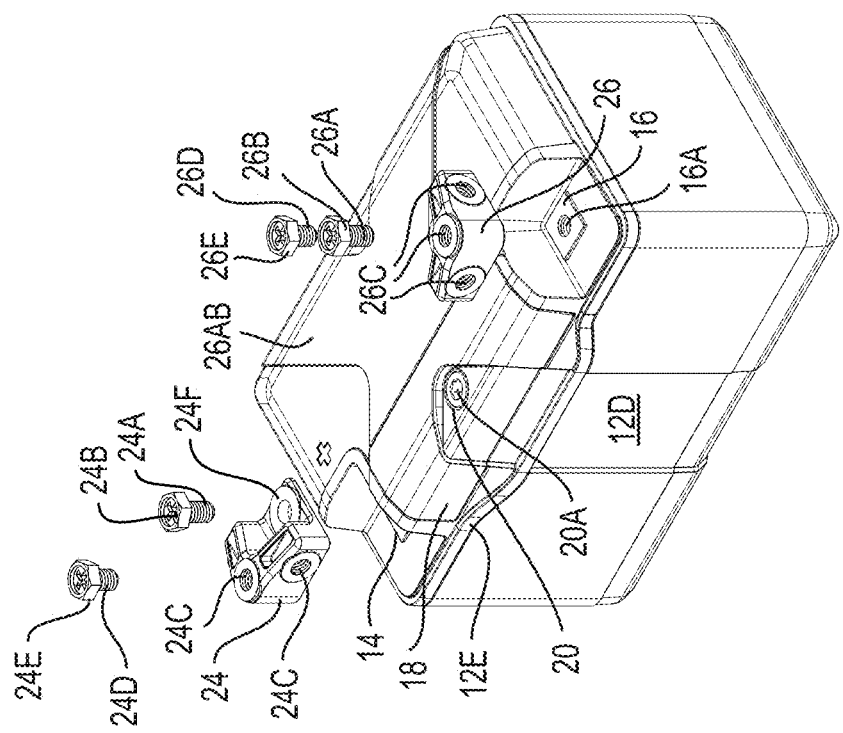
FIG. 38 is an exploded perspective view of the battery shown in FIG. 1 being fitted with external removable terminals via bolts.
Figure 47:
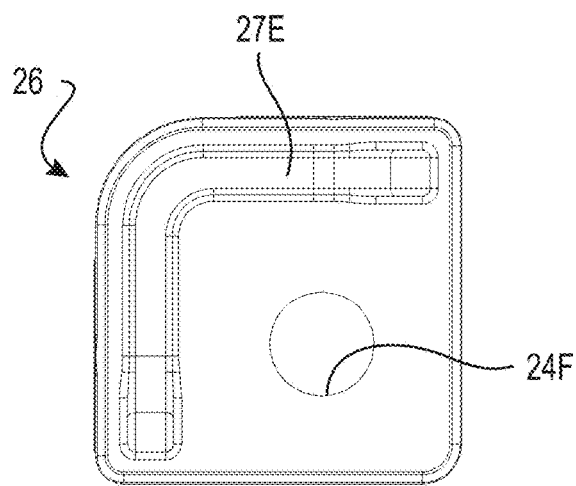
FIG. 47 is a bottom view of an external battery terminal shown in FIG. 43.
Figure 48:
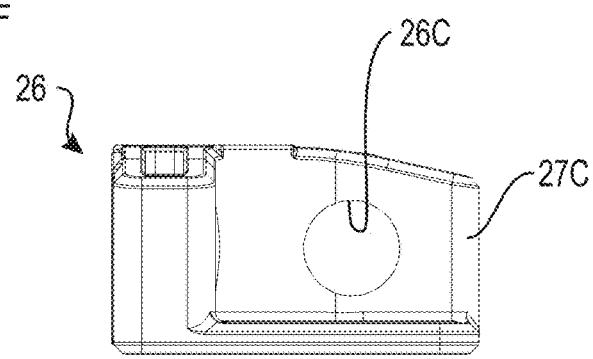
FIG. 48 is a left side view of an external battery terminal shown in FIG. 43.
Figure 49:
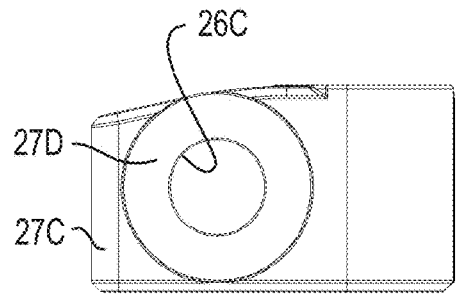
FIG. 49 is a right side view of an external battery terminal shown in FIG. 43.
Figure 50:
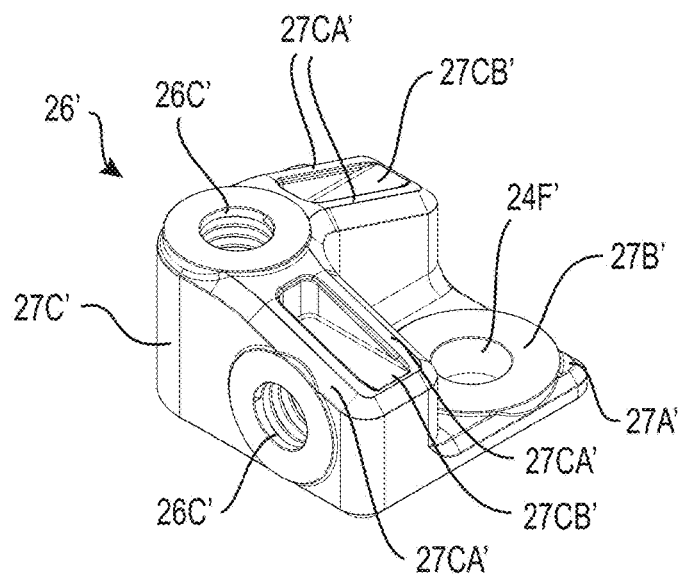
FIG. 50 is a perspective view of another external battery terminal according to the present invention.
Figure 51:
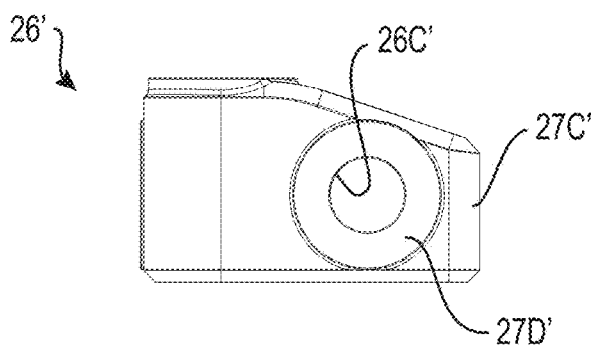
FIG. 51 is a front view of an external battery terminal shown in FIG. 50.
Figure 52:
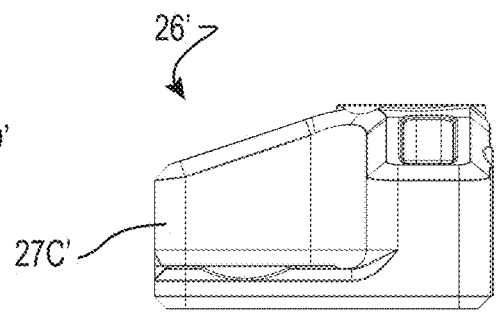
FIG. 52 is a rear view of an external battery shown in FIG. 50.
Figure 57:
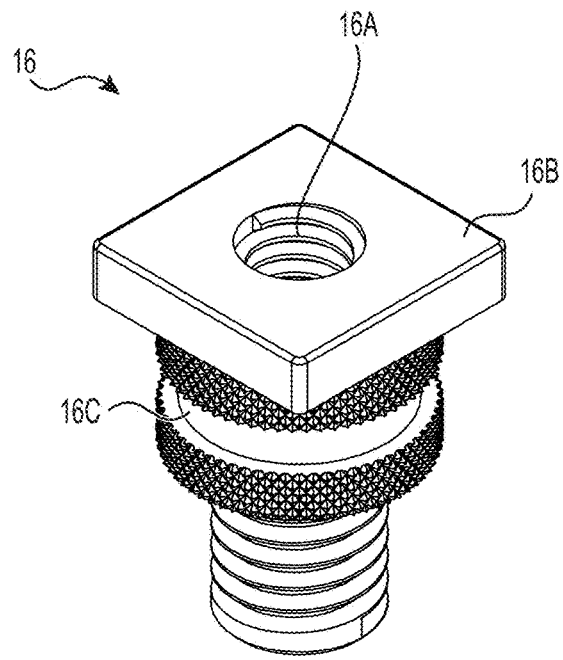
FIG. 57 is a perspective view of an insert molded type battery terminal according to the present invention.
Figure 58:
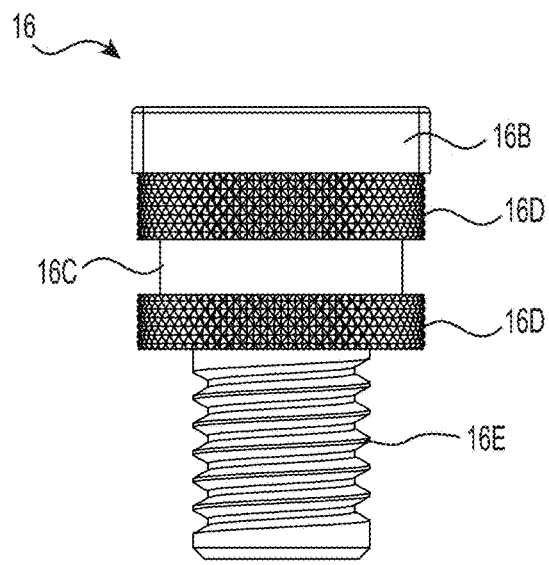
FIG. 58 is a front view of the insert molded type battery terminal shown in FIG. 57.
Figure 59:
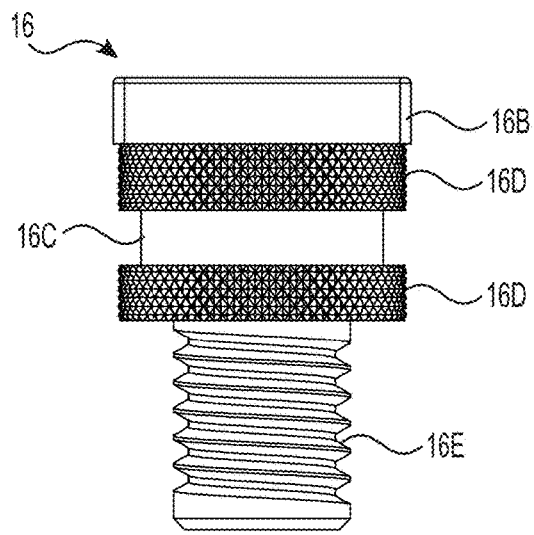
FIG. 59 is a rear view of the insert molded type battery terminal shown in FIG. 57.
Figure 60:
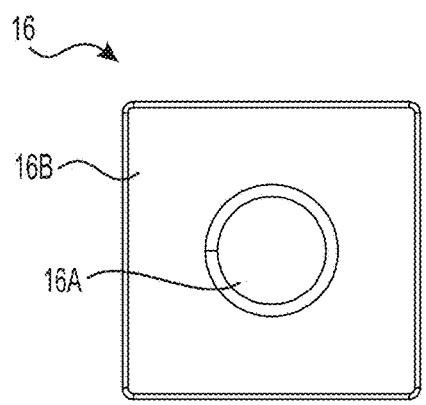
FIG. 60 is a top view of the insert molded type battery terminal shown in FIG. 57.
Figure 61:
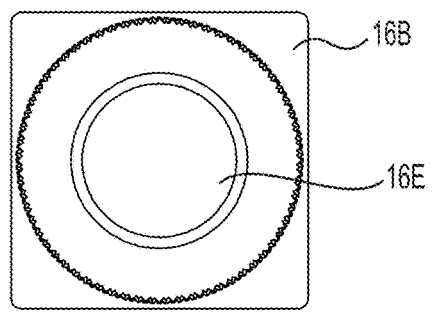
FIG. 61 is a bottom view of the insert molded type battery terminal shown in FIG. 57.
Figure 62:
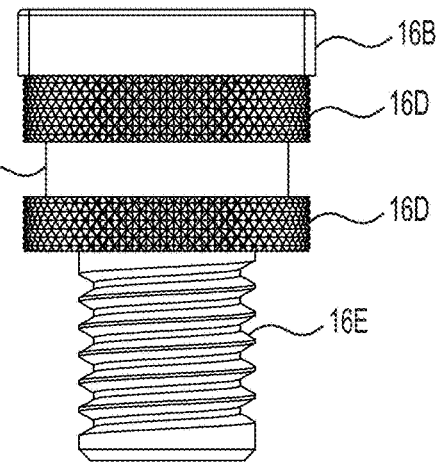
FIG. 62 is a left side view of the insert molded type battery terminal shown in FIG. 57.
Figure 63:
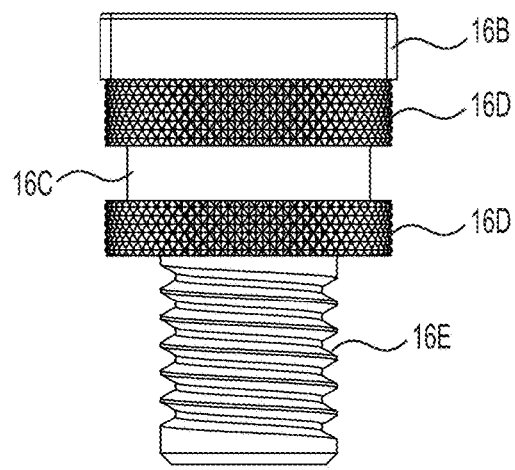
FIG. 63 is a right side view of the insert molded type battery terminal shown in FIG. 57.

The terminal 26, for example, comprises a rectangular-shaped base 27A having a raised circular-shaped surround 27B accommodating the through hole 24F. An L-shaped flange 27C extends upwardly from the rectangular-shaped base 27A. The two (2) sides of the flange 27C are each provided with the threaded through holes 26C to accommodate a bolt, for example, for connecting a battery cable to the terminal 26 at two (2) different locations depending on the particular application. The top of the flange 27C is provided with a threaded hole 26C to accommodate bolt 26A (FIG. 38) for connecting the terminal 26 to the insert molded type terminal 16 of the rechargeable battery 10. The terminal 26 is provided with raised round-shaped surrounds 27D accommodating the threaded holes 26C. The flange 27C is provided with ribs 27CA defining recesses 27CB to structurally strengthen the flange 27C structure and arrangement. The bottom of the flange 26 is provided with an L-shaped recess 27E, as shown in FIG. 47.

The terminal 26 can be a molded metal part, or machined from a billet or block of conductive metal (e.g. lead, copper, aluminum, bronze). The raised circular-shaped portions 27B, 27D can be machined flat (e.g. milled) after molding the part to finish the surrounds to the through holes 26C, 26F.

Another design of the terminal 26' is shown in FIGS. 50-56. In this design, the flange 27C' is provided with only a single threaded hole 26C', and the surround 27D' on top of the flange 27C' is modified due to an enlarge surround 27B.

A detailed view of the insert molded type terminal 16 (FIGS. 57-63) is shown in FIGS. 43-49. The insert molded type terminal 14 is a mirror image of the insert molded type terminal 16.

The insert molded type terminal 16 includes a rectangular-shaped plate 16B having the threaded hole 16A located on top of a cylindrical-shaped body 16C having a pair of spaced apart ring-shaped portions 16D. The outer surface of the ring shaped portion 16D is knurled to enhance gripping when insert molded type into the wall of the upper section 12A of the battery casing 12. A threaded body 16E extends downwardly from the cylindrical-shaped body 16C.

Rechargeable Battery Assembly

Figure 64:
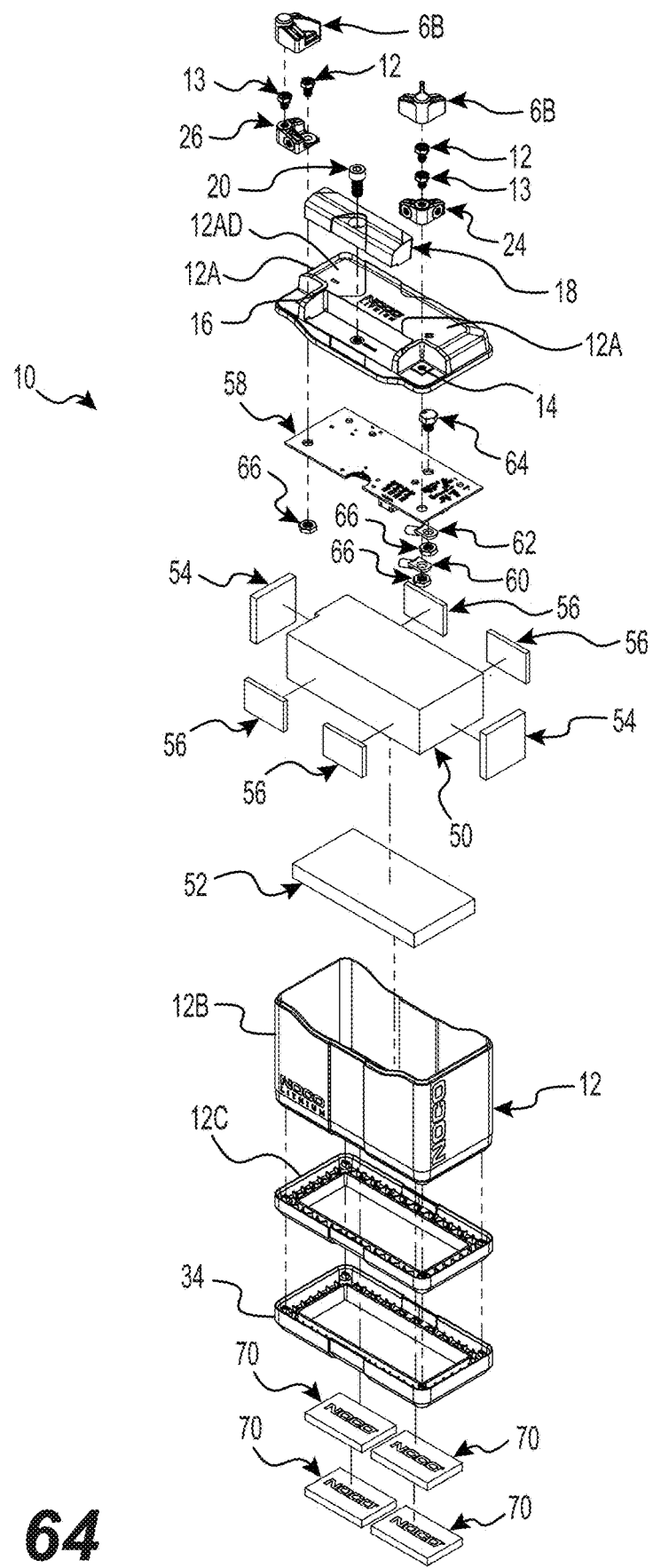
FIG. 64 is an exploded perspective view of the battery shown in FIG. 1 showing the components or parts thereof.

The structure and arrangement of the assembled rechargeable battery 10 (i.e. rechargeable battery assembly) is shown in FIG. 64.

The battery casing 12 includes the upper section 12A, middle section 12B, and lower section 12C. The cover 18 removably connects to the upper section 12A via the bolt 20.

A rechargeable battery pack 50 is disposed or installed within the battery casing 12. For example, bottom foam block 52 and side foam blocks 54, 56 are installed around the rechargeable battery pack 50 to center and protect the installed rechargeable battery pack 50 within the battery casing 12.

A circuit board 58 is then installed above the rechargeable battery pack 50. A positive ring terminal 60 is connected a positive terminal of the circuit board 58 via the threaded end of the insert molded type positive terminal 14. The positive ring terminal 60 is connected to the positive terminal of the rechargeable battery pack 50 via a positive battery cable (not shown). A negative ring terminal 62 is connected to a negative terminal of the circuit board 58 via a bolt 64. The negative ring terminal 62 is connected to the negative terminal of the rechargeable battery pack 50 via a negative battery cable (not shown). The threaded end of the insert molded type negative terminal 16 is connected to another negative terminal of circuit board 58. The nuts 66 are used to connect the threaded ends of the insert molded type terminals 14, 16 and the ring terminals 60, 62 to the circuit board 58.

A pair of terminal covers 68 are removably connected to the terminals 24, 26. Further, four (4) foam blocks 70 can be placed inside center of the trays for packaging.

Battery Management System (BMS) with Circuit Board

Figure 65:
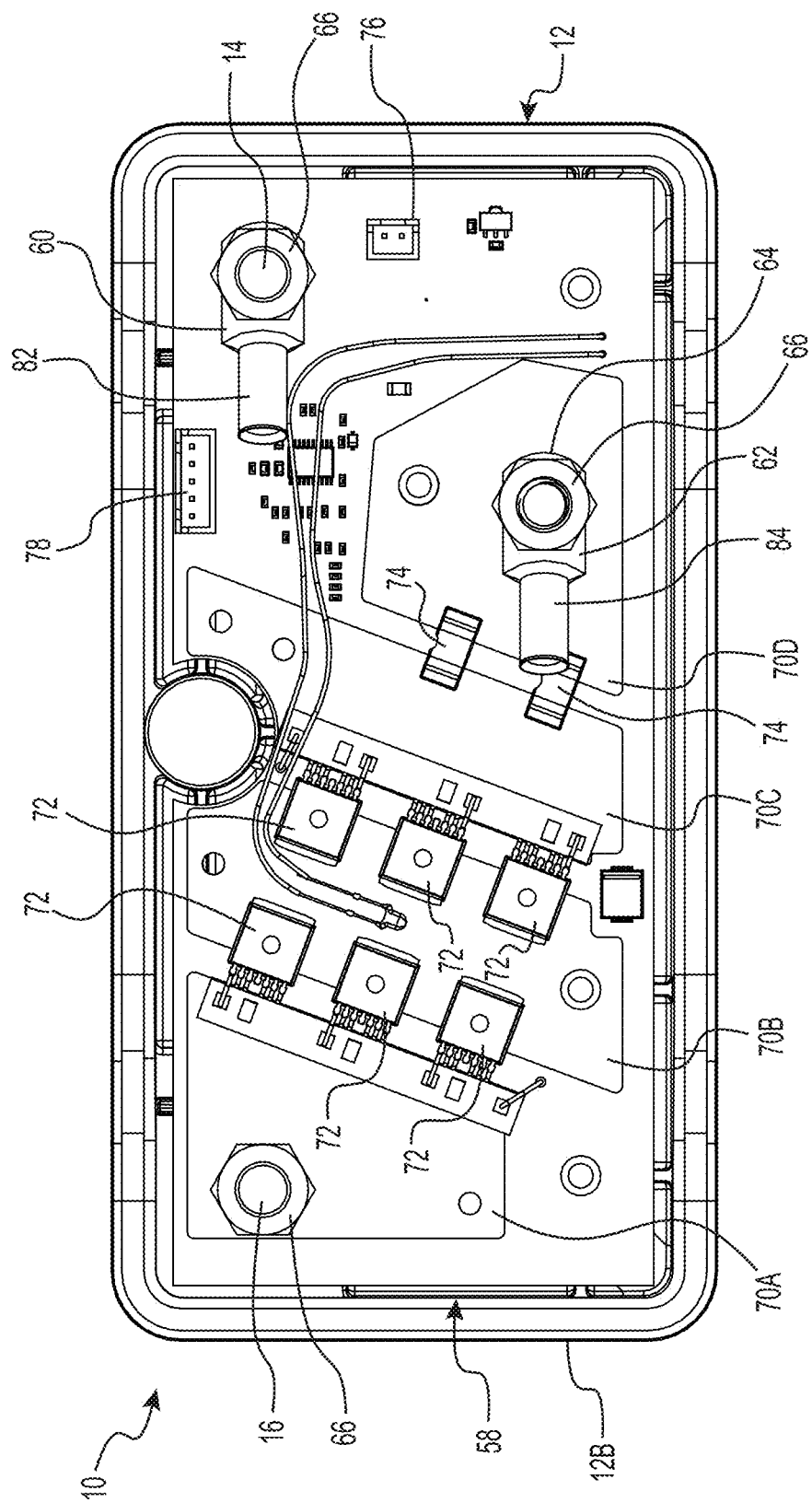
FIG. 65 is a planar view of the battery management system (BMS) printed circuit board according to the present invention and shown in FIG. 64.
Figure 66:
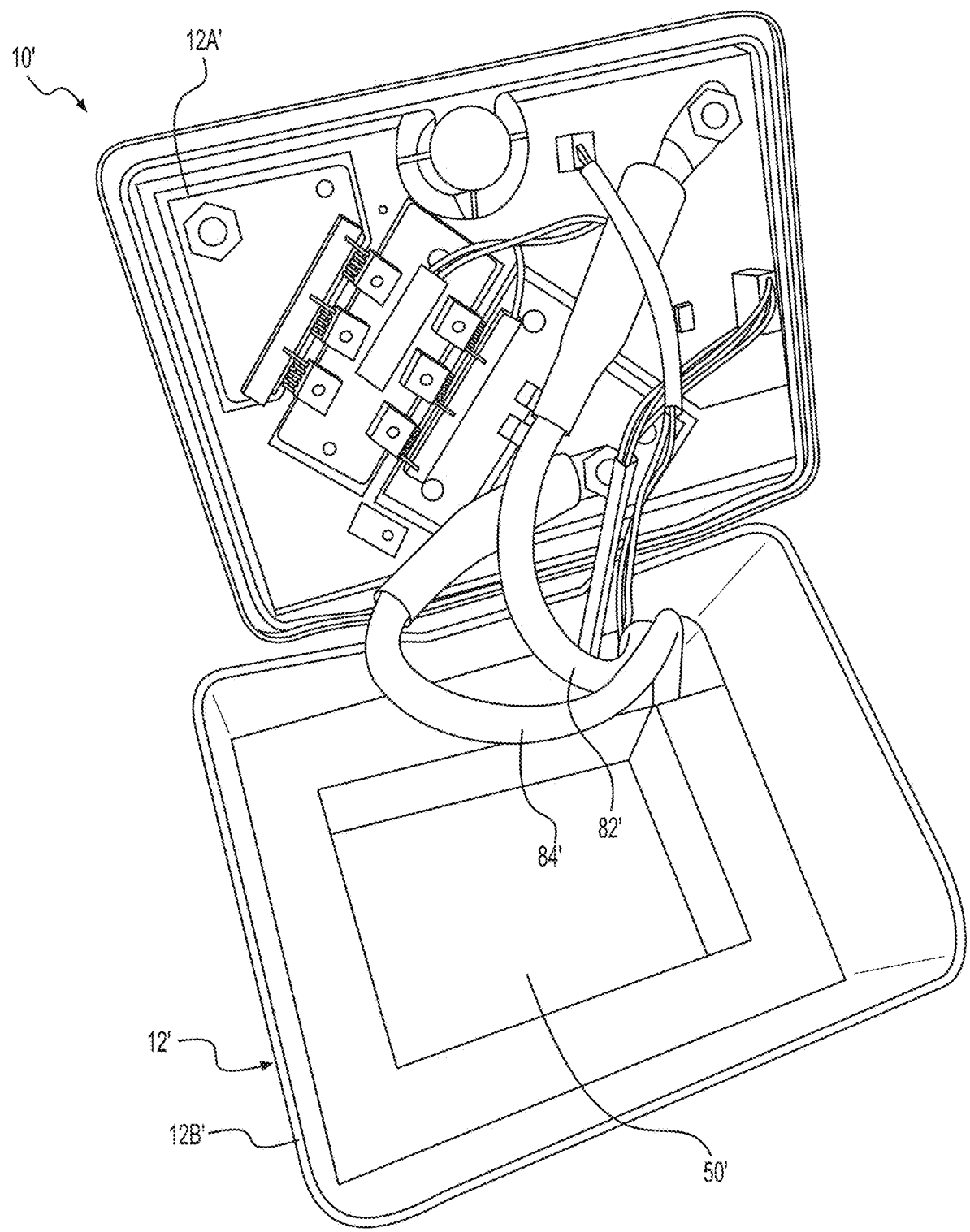
FIG. 66 is a disassembled perspective view of a battery according to the present invention similar to the battery shown in FIG. 1.
Figure 67:
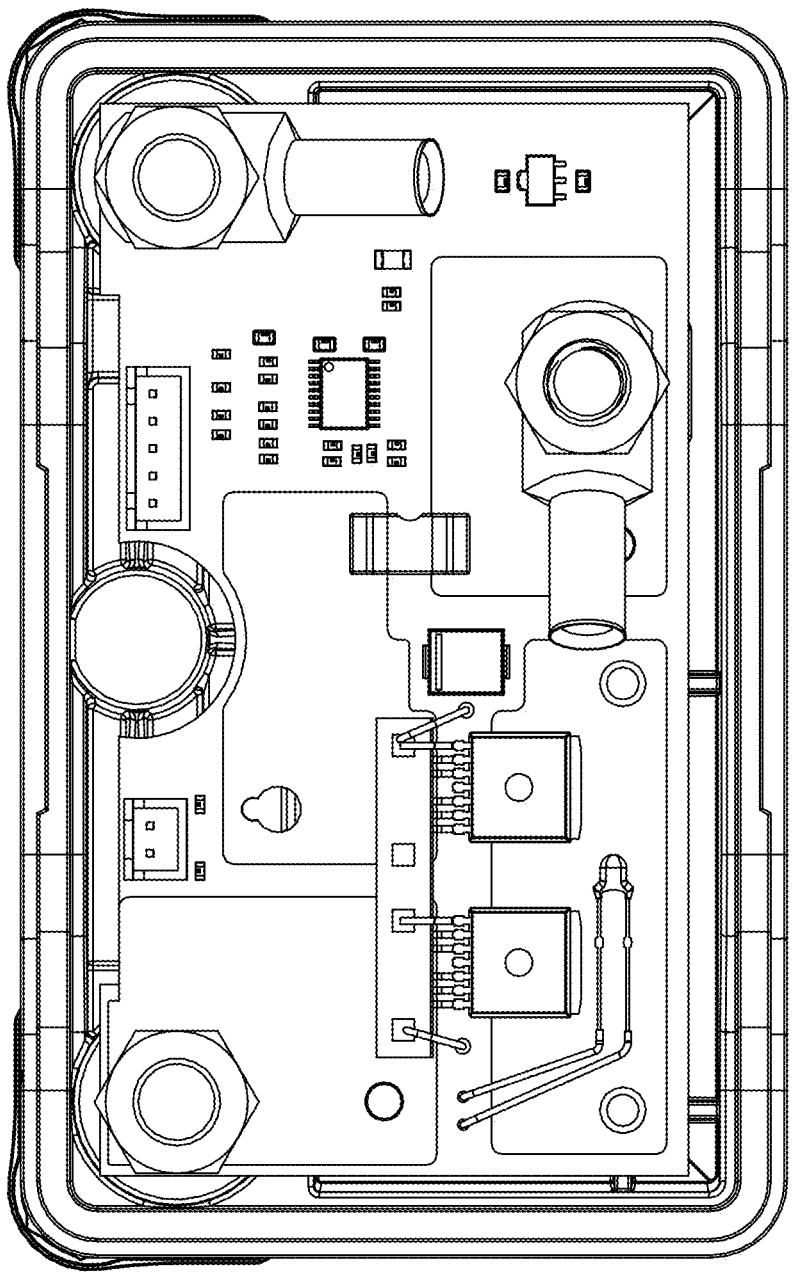
FIG. 67 is a planar view of another battery management system (BMS) printed circuit board.
Figure 68:
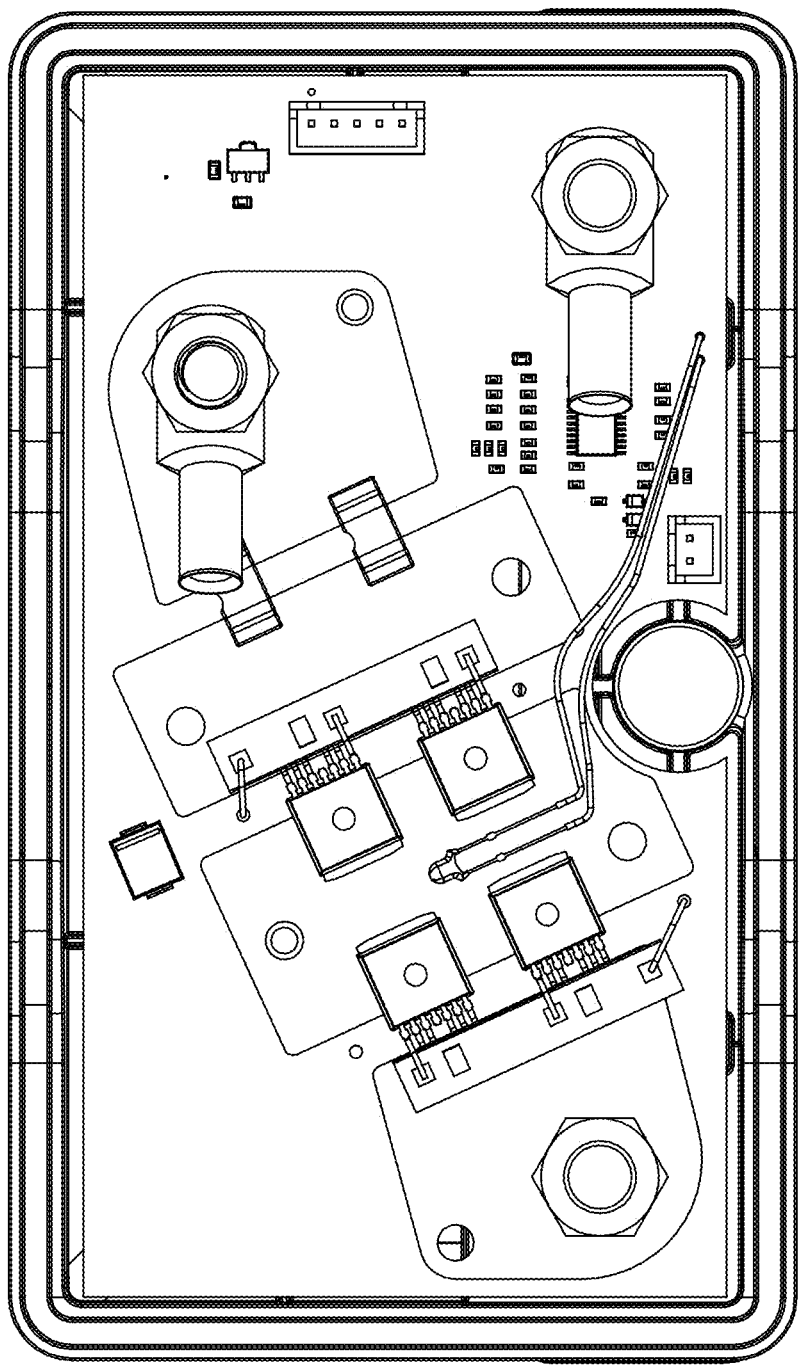
FIG. 68 is a planar view of a further battery management system (BMS) printed circuit board.

The rechargeable battery 10 includes a battery management system (BMS) circuit board 58, as shown in FIGS. 64 and 65. The circuit board 58 shown in FIG. 65, for example, is oriented upside down when being installed within the battery casing 12, as shown in FIG. 64.

The circuit board 58 includes spaced apart conductive (e.g. copper) plates 70A, 70B, 70C, 70D each having one or more inclined edges relative to the length of the circuit board 58. Three (3) MOSFETs 72 are installed between (i.e. bridge) conductive plates 70A and 70B and another three (3) MOSFETs 72 are installed between conductive plates 70B and 70C, as shown in FIG. 65. Two (2) current sense resistors 74 are installed between (i.e. bridging) conductive plates 70C and 70D. The circuit board 58 also includes a 2 pin connector 76 and a 5 pin connector 78 for connection to the rechargeable battery pack 50.

A positive battery cable 82 connects between the positive terminal of the rechargeable battery pack 50 and the positive ring terminal 60. The positive ring terminal 60 is connected to the threaded end of the insert molded type positive terminal 14 and the circuit board 58 via nut 66.

A negative battery cable 84 connects between the negative terminal of the rechargeable battery pack 50 and the negative ring terminal 62. The negative ring terminal 62 is connected to the conductive plate 70D of the circuit board 58 via bolt 64 and nut 66.

The threaded end of the insert molded type negative terminal 16 connects to the conductive plate 70A of the circuit board 58 via the nut 66.

Figure 69:
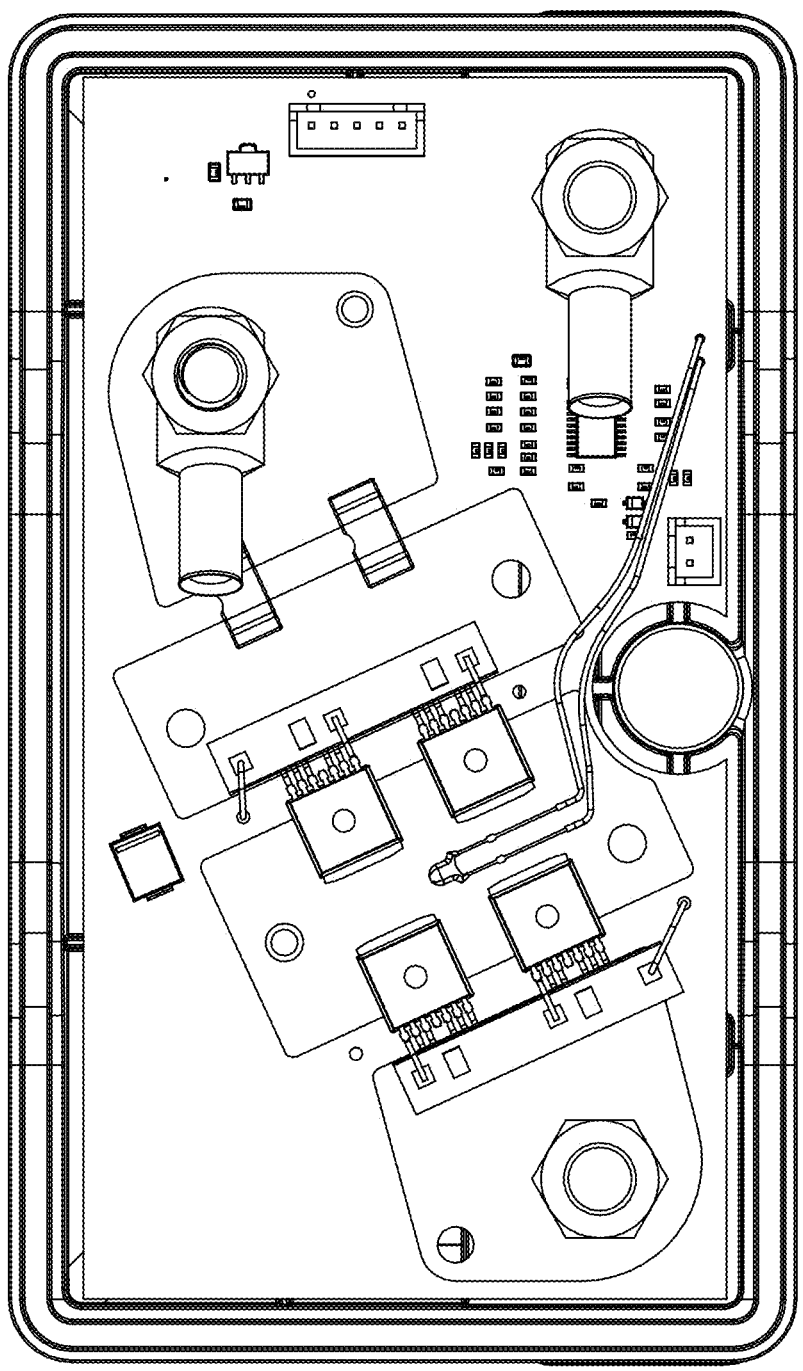
FIG. 69 is a planar view of an even further battery management system (BMS) printed circuit board.
Figure 70:
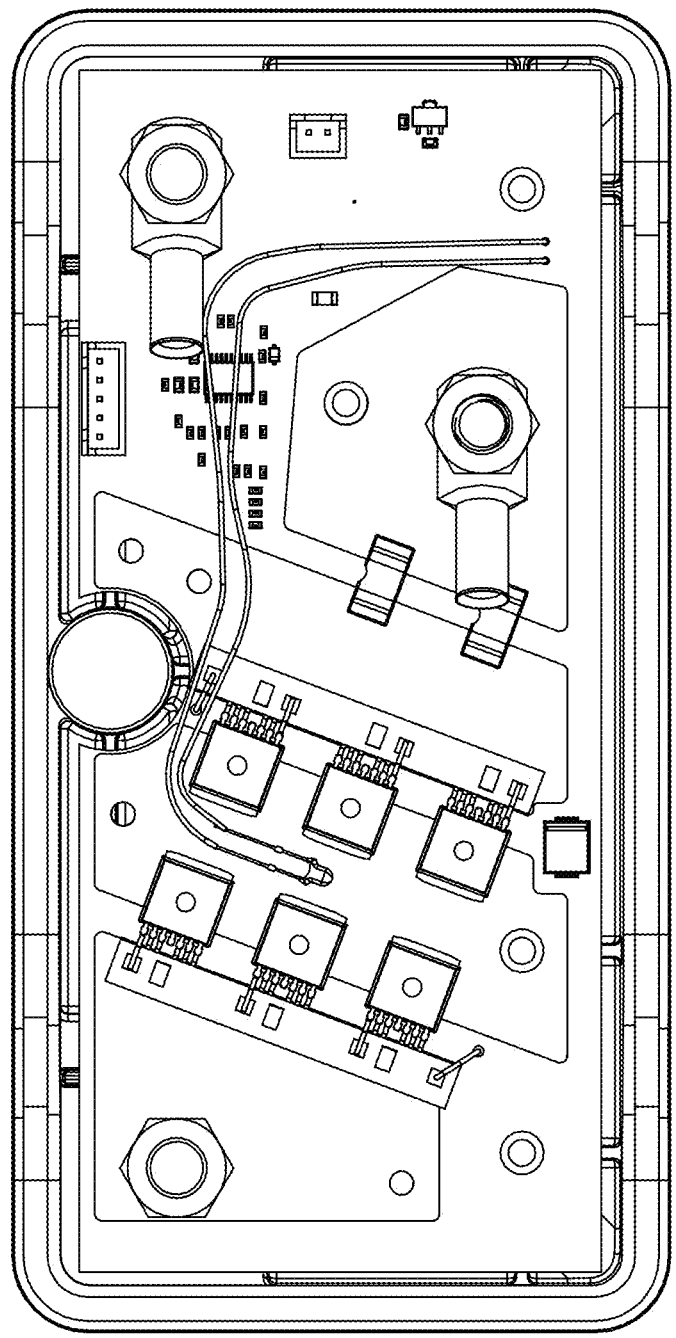
FIG. 70 is a planar view of the battery management system (BMS) printed circuit board shown in FIG. 65.
Figure 71:
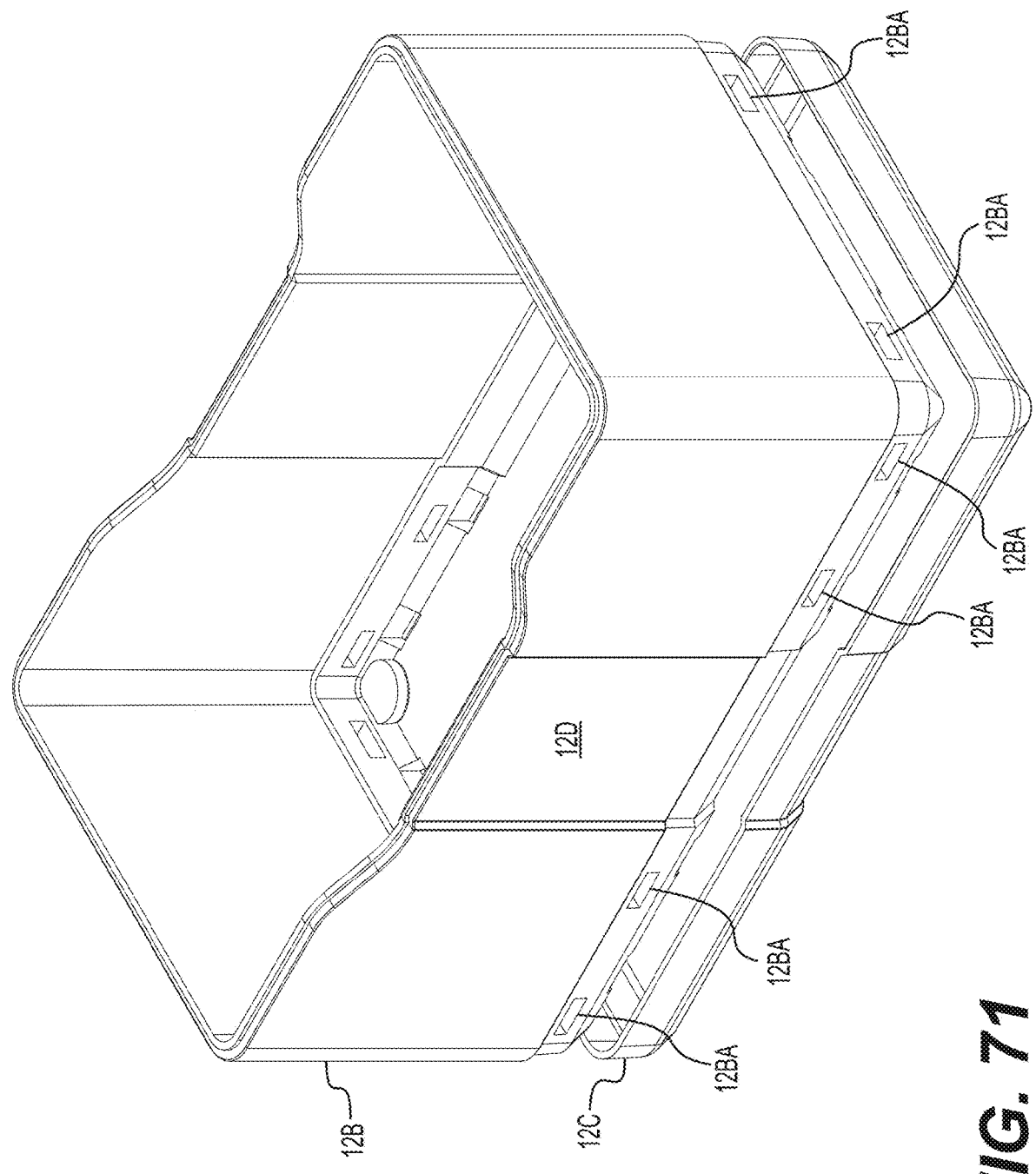
FIG. 71 is a perspective view of the middle section and lower section of the battery casing of the battery shown in FIG. 1 showing the snap fit connection between the middle section and lower section of the battery casing.
Figure 72:
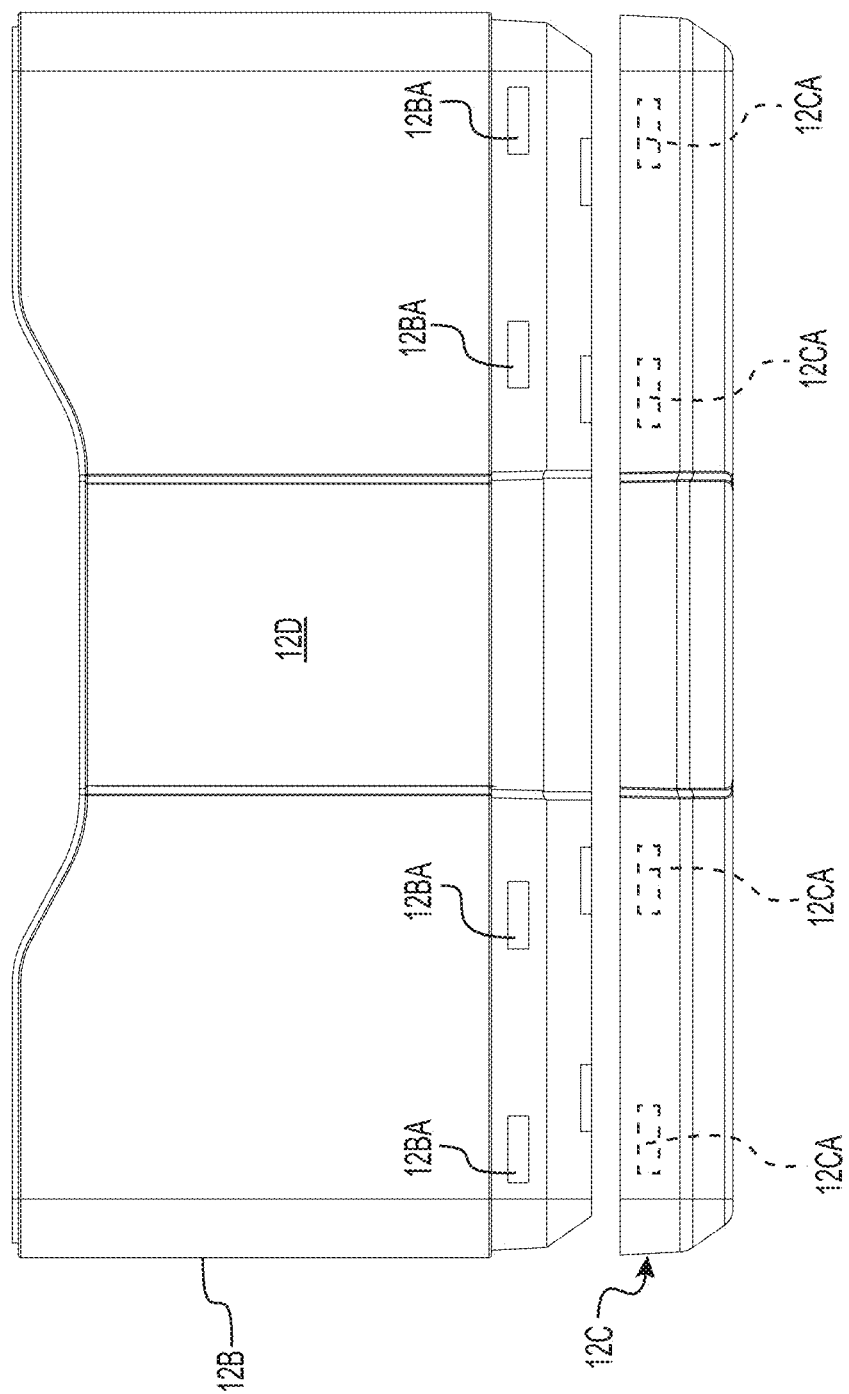
FIG. 72 is a front view of the middle section and lower section of the battery casing of the battery shown in FIG. 1 showing the snap fit connection between the middle section and lower section of the battery casing.
Figure 73:
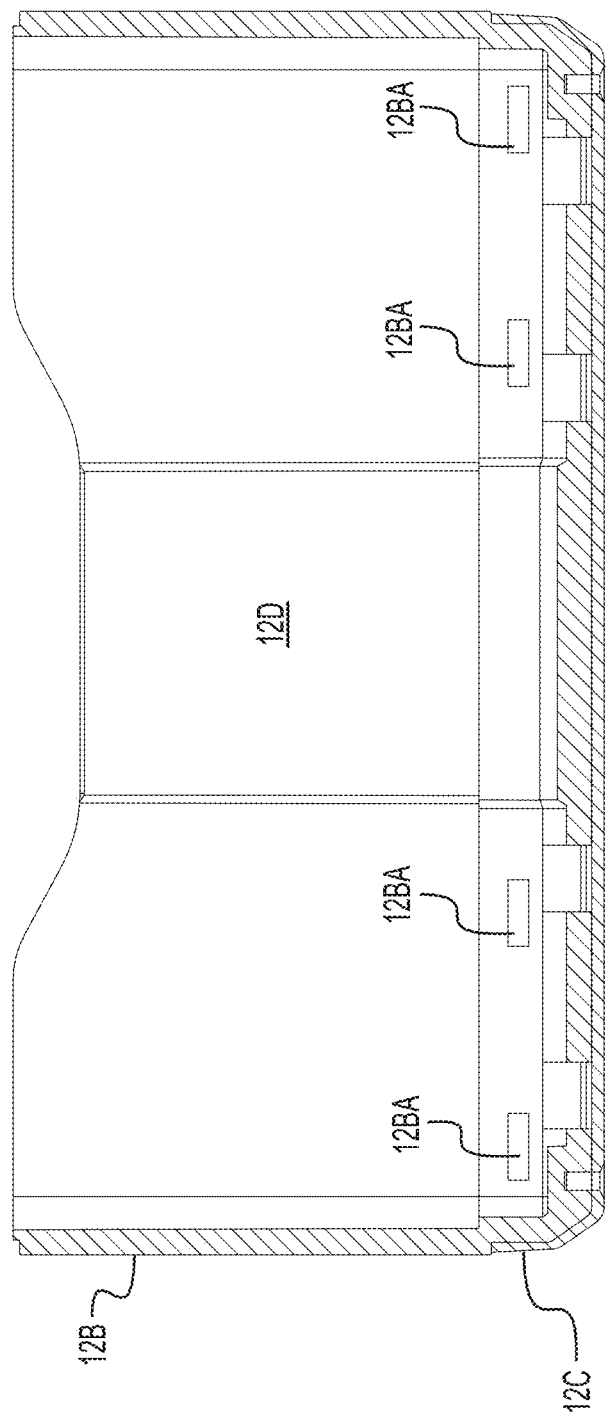
FIG. 73 is a front view of the middle section assembled to the lower section of the battery casing of the battery shown in FIG. 1 showing the snap fit connection between the middle section and lower section of the battery casing.
Figure 74:
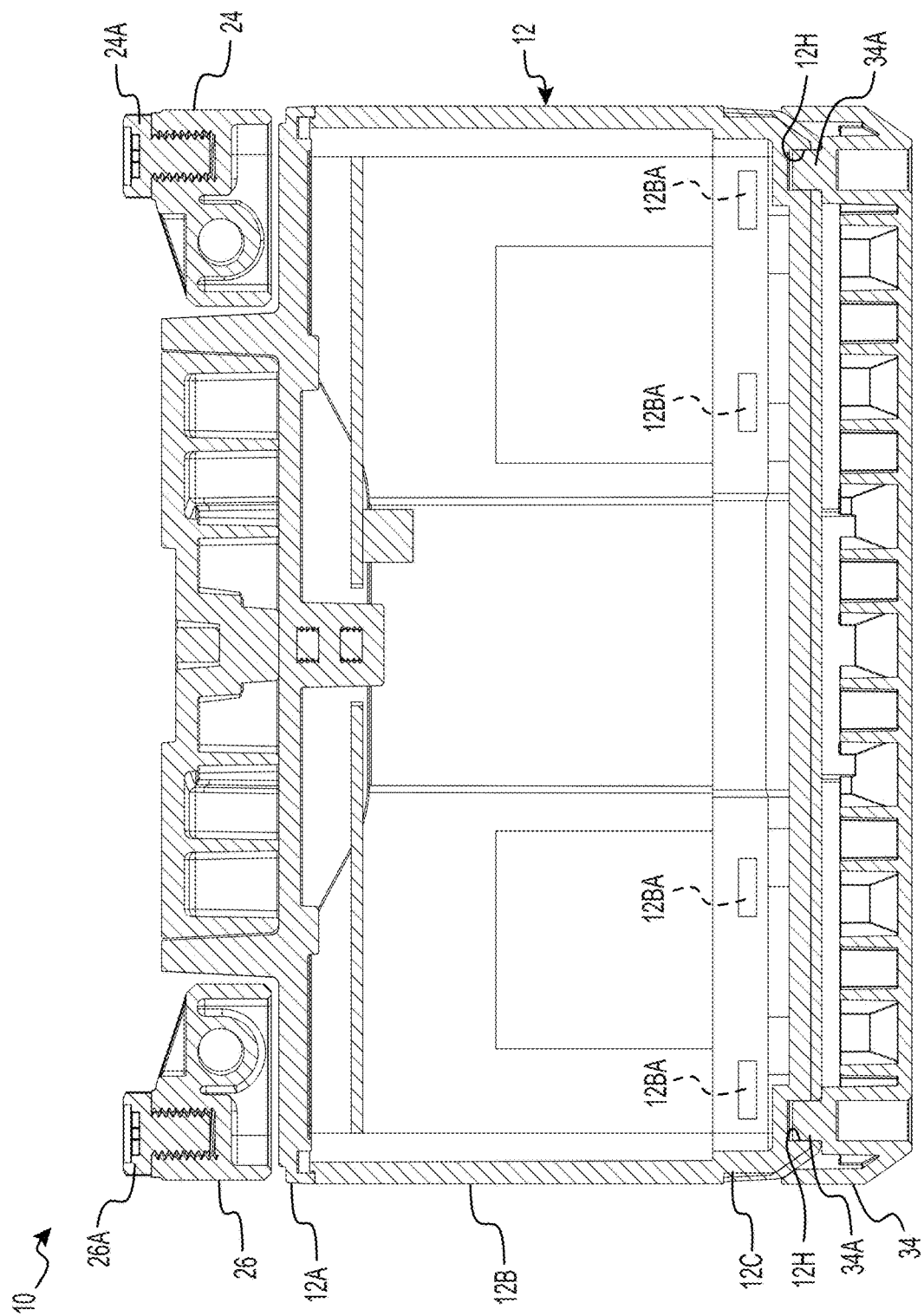
FIG. 74 is a lengthwise vertical cross-sectional view of the shown in FIG. 1 fitted with a battery tray showing the protraction of the battery tray fitting into the recessed holes in the bottom of the battery casing of the battery.

The circuit board (e.g. circuit board 58) can have various other configurations or layouts. Specifically, the shape of the conductive plates, the location and arrangement of the conductive plates on the board, the locations and arrangement of the connections with the rechargeable battery, the locations and arrangement of the insert molded type terminals 14, 16, on the board, and other features can vary from model to model, as shown in FIGS. 69-70. The circuit boards can have spaced apart conductive plates with one or more inclined edges inclined relative to a length of the circuit board and/or spaced apart conductive plates with one or more transverse edges set transverse relative to the length of the circuit board.

Snap Fit Battery Casing

A snap fit battery casing 12 is shown in FIGS. 71-74. The middle section 12B is provided with snap fit recesses 12BA configured to snap fit with protrusions 12CA on the inside rim of the lower section 12B. This arrangement allows the middle section 12B and lower section 12C to snap fit together during assembly of the casing. The same arrangement can be provided between the upper section 12A and 12B.

The lower section 12C can be provided or fitted with a tray (e.g. tray 34 as shown). The tray 34 is provided with four (4) protrusions 34A configured to be received within recessed holes 12H located on the bottom of the lower section 12C of the battery casing 12.

DRAWING SCHEDULE

10 rechargeable battery
12 battery casing
12A upper section
12AA upper wall
12AB X-shaped protrusion
12AC molded positive symbol
12AD molded negative symbol
12AE receiver
12B middle section
12C lower section
12D vertical channel
12E curved horizontal rib
12F vertical channel
12G curved horizontal rib
14 insert molded type positive battery terminal
14A threaded hole
16 insert molded type negative battery terminal
16A threaded hole
18 cover
18A bolt head receiver
18B through hole
18C cell
18D rib
20 bolt
20A bolt head
22 insert molded type anchor
22A threaded hole
24 positive terminal
24A bolt
24B bolt head
24C threaded hole
24D bolt
24E bolt head
24F through hole
26 negative terminal
26A bolt
26B bolt head
26C threaded hole
26D bolt
26E bolt head
26F through hole
27A rectangular-shaped base
27B raised circular-shaped surround
27C L-shaped flange
27D raised circular-shaped surround
27E L-shaped recess
30 tray
30A protrusion
32 tray
32A protrusion
34 tray
34A protrusion
50 rechargeable battery pack
52 bottom foam block
54 side foam block
56 side foam block
58 circuit board
60 positive ring terminal
62 negative ring terminal
64 bolt
66 nut
68 terminal cover
70 foam block
70A conductive plate
70B conductive plate
70C conductive plate
70D conductive plate
72 MOSFET
74 current sense resistor
76 2 pin connector
78 5 pin connector

The invention claimed is:

1. A rechargeable battery, comprising:
a battery casing comprising a top section, middle section, and lower section connected together;
a positive battery terminal connected to the battery casing;
a negative battery terminal connected to the battery casing;

a rechargeable battery pack disposed within the battery casing; and a battery management system comprising a circuit board, the circuit board electrically connected to the positive battery terminal and the negative battery terminal, the circuit board being electrically connected to the rechargeable battery pack, wherein the circuit board comprises multiple spaced apart copper plates, and wherein the circuit board comprises one or more MOSFETs bridging a pair of the spaced apart copper plates.

2. The battery casing according to claim 1, wherein the top section is defined by an outer perimeter wall extending downwardly from an upper wall, wherein the middle section is defined by the outer perimeter wall extending upwardly from a bottom wall, and wherein the lower section is defined by the outer perimeter wall extending upwardly from the bottom wall.

3. The battery casing according to claim 2, wherein the positive battery terminal is spaced apart from the negative battery terminal, and wherein the positive battery terminal and negative battery terminal extend through the upper wall of the top section of the battery casing.

4. The battery casing according to claim 3, wherein the positive battery terminal is an insert molded type positive battery terminal insert molded type into the upper wall of the top section of the battery casing, and wherein the negative battery terminal is an insert molded type negative battery terminal insert molded type into the upper wall of the top section of the battery casing.

5. The battery casing according to claim 2, further comprising a removable cover disposed within an upper receiver in the upper wall of the top section of the battery casing.

6. The battery casing according to claim 5, wherein the removable cover is connected to the upper wall of the top section of the battery casing by a fastener.

7. The battery casing according to claim 1, further comprising an external removable positive terminal connected to the positive battery terminal, and an external removable negative terminal connected to the negative battery terminal.

8. The battery casing according to claim 1, wherein the top section and the lower section of the battery casing are heat welded together during assembly of the battery casing.

9. The battery casing according to claim 1, wherein the middle section and the lower section of the battery casing are configured to snap fit together during assembly of the battery casing.

10. The battery according to claim 1, further comprising a positive cable connecting the rechargeable battery pack to the circuit board, and a negative cable connecting the rechargeable battery pack to the circuit board.

11. The battery according to claim 10, wherein the positive battery terminal is spaced apart from the negative battery terminal, and wherein the positive battery terminal and negative battery terminal extend through the upper wall of the top section of the battery casing.

12. The battery according to claim 11, wherein the positive battery terminal is an insert molded type positive battery terminal insert molded type into the upper wall of the top section of the battery casing, and wherein the negative battery terminal is an insert molded type negative battery terminal insert molded type into the upper wall of the top section of the battery casing.

13. The battery according to claim 10, further comprising an external removable positive terminal connected to the positive battery terminal, and an external removable negative terminal connected to the negative battery terminal.

14. The battery according to claim 10, wherein the top section and the lower section of the battery casing are heat welded together during assembly of the battery casing.

15. The battery according to claim 10, wherein the middle section and the lower section of the battery are snap fit together during assembly of the battery casing.

16. The battery according to claim 10, wherein the top section is defined by an outer perimeter wall extending downwardly from an upper wall, wherein the middle section is defined by the outer perimeter wall extending upwardly from a bottom wall, and wherein the lower section is defined by the outer perimeter wall extending upwardly from the bottom wall.

17. The battery according to claim 1, wherein the circuit board comprises one or more current sense resistors bridging another pair of the spaced apart copper plates.

18. The battery according to claim 1, wherein each copper plate comprises one or more inclined edges relative to a length dimension of the circuit board.

19. The battery according to claim 1, wherein each copper plate comprises one or more transverse edges relative to a length dimension of the circuit board.

20. The battery according to claim 1 wherein the circuit board is physically connected to the positive battery terminal and the negative battery terminal.

21. The battery according to claim 20, wherein the positive battery terminal includes a threaded portion extending into the casing and physically connecting to the circuit board, and the negative battery terminal includes a threaded portion extending into the casing and physically connecting to the circuit board.

22. The battery according to claim 1, further comprising one or more trays connected to a lower end of the battery casing.

23. The battery according to claim 22, wherein the one or more trays is configured so that the lower end of the battery casing nests within the one or more trays.

24. The battery according to claim 23, wherein the one or more trays is configured with one or more protrusions to connect with one or more receivers in the lower end of the battery casing.

25. The battery according to claim 22, wherein the one or more trays is configured with one or more protrusions to connect with one or more receivers in the lower end of the battery casing.

26. The battery according to claim 22, wherein the one or more trays is connected to the lower section of the battery casing.

27. The battery according to claim 22, wherein the one or more trays is multiple trays connected together with the battery casing.

28. The battery according to claim 27, wherein the multiple trays have a same height.

29. The battery according to claim 27, wherein the multiple trays have at least two different heights.

30. A battery tray for use with a battery for extending a height of the battery, the battery tray comprising a lower wall with an inner perimeter wall extending upwardly from the lower wall and an outer perimeter wall extending upwardly from the lower wall, the inner perimeter wall being spaced apart from the outer perimeter wall, the battery tray being configured to connect to a lower end of the battery, wherein the battery tray comprises one or more protrusions configured to connect to one or more receivers provided in a bottom portion of the battery.

31. The battery tray according to claim 30, wherein the battery tray is configured so that the lower end of the battery nests within the battery tray.

32. The battery tray according to claim 31, wherein a height of the inner perimeter wall is less than a height of the outer perimeter wall.

33. The battery tray according to claim 31, wherein the battery tray comprises the one or more protrusions configured to connect to the one or more receivers provided in the bottom portion of the battery.

34. The battery tray according to claim 33, wherein the battery tray is rectangular-shaped, and the one or more protrusions are four protrusions located adjacent to four corners of the battery tray cooperating with four recessed holes in the bottom portion of the battery.

35. The battery tray according to claim 30, wherein the battery tray is bottomless inside the inner perimeter wall.

36. The battery tray according to claim 30, wherein the battery tray is provided with a bottom wall located inside and connected to the inner perimeter wall.

* * * * *